US012805015B2

(12) United States Patent
Wang et al.

(10) Patent No.: US 12,805,015 B2
(45) Date of Patent: Nov. 17, 2026

(54) ARRAY SUBSTRATE, DISPLAY PANEL AND DISPLAY DEVICE

(71) Applicants: Beijing BOE Display Technology Co., Ltd., Beijing (CN); BOE TECHNOLOGY GROUP CO., LTD., Beijing (CN)

(72) Inventors: Xiao Wang, Beijing (CN); Yu Ma, Beijing (CN); Yan Yan, Beijing (CN); Weitao Chen, Beijing (CN); Xiaona Liu, Beijing (CN); Jianjun Wang, Beijing (CN); Lijiao Shen, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 413 days.

(21) Appl. No.: 18/272,214

(22) PCT Filed: Mar. 31, 2022

(86) PCT No.: PCT/CN2022/084629

§ 371 (c)(1),
(2) Date: Jul. 13, 2023

(87) PCT Pub. No.: WO2023/184426

PCT Pub. Date: Oct. 5, 2023

(65) Prior Publication Data

US 2024/0387559 A1 Nov. 21, 2024

(51) Int. Cl.
*H10D 86/60* (2025.01)
*G02F 1/1339* (2006.01)
(Continued)

(52) U.S. Cl.
CPC ......... *H10D 86/60* (2025.01); *G02F 1/13394* (2013.01); *G02F 1/13396* (2021.01);
(Continued)

(58) Field of Classification Search
CPC .................. H10D 86/60; H10D 86/441; G02F 1/136286; G02F 1/1343; G02F 1/136; G02F 1/1362
See application file for complete search history.

(56) References Cited

U.S. PATENT DOCUMENTS

2002/0021396 A1 2/2002 Yoo et al.
2002/0093614 A1 7/2002 Moon et al.
(Continued)

FOREIGN PATENT DOCUMENTS

CN 104423113 A 3/2015
CN 104880871 A 9/2015
(Continued)

OTHER PUBLICATIONS

First Chinese Office Action in Chinese Application No. 202280000659.X dated Nov. 22, 2025 with English translation.
(Continued)

*Primary Examiner* — Thanh Y. Tran
(74) *Attorney, Agent, or Firm* — Collard & Roe, P.C.

(57) ABSTRACT

An array substrate, a display panel and a display device. In the array substrate, the plurality of pixel units are located on a side of a base substrate; the common electrode line includes a horizontal common electrode line and a vertical common electrode line, the horizontal common electrode line is electrically connected with the vertical common electrode line, the plurality of pixel units are arranged in an array to form a plurality of pixel rows and a plurality of pixel columns, each of the pixel rows extends along the first direction, and each of the pixel columns extends along the second direction, the horizontal common electrode line extends along the first direction, the vertical common electrode line extends along the second direction, the horizontal common electrode line is overlapped with a plurality of effective display regions of a same pixel row.

18 Claims, 9 Drawing Sheets

100

(51) Int. Cl.
*G02F 1/1362* (2006.01)
*G02F 1/1368* (2006.01)
*H10D 86/40* (2025.01)

(52) U.S. Cl.
CPC ...... *G02F 1/136286* (2013.01); *G02F 1/1368* (2013.01); *H10D 86/441* (2025.01)

(56) References Cited

U.S. PATENT DOCUMENTS

| | | | | |
|---|---|---|---|---|
| 2014/0320446 | A1* | 10/2014 | Kim ...................... | G06F 3/0446 345/174 |
| 2015/0268525 | A1 | 9/2015 | Heo et al. | |
| 2017/0277008 | A1 | 9/2017 | Jiang et al. | |
| 2020/0105791 | A1 | 4/2020 | Bai et al. | |

FOREIGN PATENT DOCUMENTS

| | | | |
|---|---|---|---|
| CN | 103163704 | B | 11/2015 |
| CN | 105093750 | A | 11/2015 |
| CN | 105629605 | A | 6/2016 |
| CN | 106597699 | A | 4/2017 |
| CN | 109164654 | A | 1/2019 |
| CN | 109976057 | A | 7/2019 |
| CN | 111208680 | A | 5/2020 |
| CN | 112540487 | A | 3/2021 |
| CN | 113946074 | A | 1/2022 |

OTHER PUBLICATIONS

International Search Report in PCT/CN2022/084629 in Chinese dated Dec. 1, 2022 with English translation.
Written Opinion of the International Searching Authority of PCT/CN2022/084629 dated Dec. 1, 2022.

* cited by examiner

ARRAY SUBSTRATE, DISPLAY PANEL AND DISPLAY DEVICE

CROSS REFERENCE TO RELATED APPLICATIONS

This application is the National Stage of PCT/CN2022/084629 filed on Mar. 31, 2022, the disclosure of which is incorporated by reference.

TECHNICAL FIELD

At least one embodiment of the present disclosure relates to an array substrate, a display panel and a display device.

BACKGROUND

With the continuous development of display technology, the thin film transistor-liquid crystal display (TFT-LCD) device has gradually become the mainstream display device in the market. Generally, the thin film transistor liquid crystal display device includes an array substrate, an opposite substrate, and a liquid crystal layer interposed between the array substrate and the opposite substrate. The thin film transistor liquid crystal display device can change orientations of liquid crystal molecules in the liquid crystal layer between the array substrate and the opposite substrate by using change of an electric field intensity on the liquid crystal layer, so that intensity of light transmission is controlled to realize displaying of images.

The array substrate may include elements such as gate lines, data lines, driving transistors, pixel electrodes, and common electrodes; the gate lines are connected with the gate electrodes of the driving transistors, so that the turn-on and turn-off of the driving transistors can be controlled; the data lines are connected with the source electrodes of the driving transistors, and the pixel electrodes are connected with the drain electrodes of the driving transistors. In a case that one of the driving transistors is turned on under driving of one of the gate electrodes, the data line can apply a driving voltage to the pixel electrode through the driving transistor; a common electrode line is connected with the common electrode, and is configured to apply a common voltage to the common electrode, and the pixel electrode and the corresponding common electrode can form a driving electric field, so that the orientations of the liquid crystal molecules in the liquid crystal layer are changed.

SUMMARY

Embodiments of the present disclosure provide an array substrate, a display panel and a display device. The array substrate includes a base substrate, a plurality of pixel units and a common electrode line; the plurality of pixel units is located on a side of the base substrate; the common electrode line includes a horizontal common electrode line and a vertical common electrode line, the horizontal common electrode line is electrically connected with the vertical common electrode line, the plurality of pixel units are arranged in an array along a first direction and a second direction to form a plurality of pixel rows and a plurality of pixel columns, each of the pixel rows extends along the first direction, and each of the pixel columns extends along the second direction, the horizontal common electrode line extends along the first direction, the vertical common electrode line extends along the second direction, each of the plurality of pixel units comprises an effective display region, the horizontal common electrode line is overlapped with a plurality of effective display regions of a same pixel row. In the array substrate, the horizontal common electrode line is overlapped with a plurality of effective display regions of the same pixel row, and is not arranged in a region outside the plurality of effective display regions to be covered by the black matrix; although the horizontal common electrode line itself will block light from the effective display regions, the black matrix does not need to cover the horizontal common electrode line and the intervals between the horizontal common electrode line and the adjacent gate lines, so that a width of the black matrix is reduced, and the aperture ratio of the display panel adopting the array substrate is effectively increased.

At least one embodiment of the present disclosure provides an array substrate, which includes a base substrate; a plurality of pixel units, located on the base substrate; and a common electrode line, including a horizontal common electrode line and a vertical common electrode line, the horizontal common electrode line is electrically connected with the vertical common electrode line, the plurality of pixel units are arranged in an array along a first direction and a second direction to form a plurality of pixel rows and a plurality of pixel columns, each of the pixel rows extends along the first direction, and each of the pixel columns extends along the second direction, the horizontal common electrode line extends along the first direction, the vertical common electrode line extends along the second direction, each of the plurality of pixel units includes an effective display region, the horizontal common electrode line is overlapped with a plurality of effective display regions of a same pixel row.

For example, in the array substrate provided by an embodiment of the present disclosure, the effective display region comprises a first domain and a second domain arranged in the second direction, and the horizontal common electrode line is located between the first domain and the second domain.

For example, the array substrate provided by an embodiment of the present disclosure further includes: a plurality of gate lines, arranged along the second direction; and a plurality of data lines, arranged along the first direction, each of the gate lines extends along the first direction, each of the data lines extends along the second direction, the plurality of gate lines and the plurality of data lines are arranged in different layers, and the horizontal common electrode line is arranged on a same layer as the gate lines.

For example, in the array substrate provided by an embodiment of the present disclosure, the vertical common electrode line comprises a vertical conductive part, the vertical conductive part is arranged on a same layer as the gate lines, the vertical conductive part is located between two pixel units adjacent in the first direction, the vertical conductive part is located between two gate lines of the gate lines, is intersected with the horizontal common electrode line, and form an integrated cross-shaped conductive structure at an intersection position.

For example, in the array substrate provided by an embodiment of the present disclosure, the vertical conductive part is located between two data lines adjacent in the second direction, and an orthographic projection of the vertical conductive part on the base substrate and orthographic projections of the data lines on the base substrate are spaced apart.

For example, in the array substrate provided by an embodiment of the present disclosure, the vertical common electrode line comprises a vertical connection part, the vertical connection part and the gate lines are arranged in different layers, and the vertical connection part connects two vertical conductive parts adjacent in the second direction.

For example, in the array substrate provided by an embodiment of the present disclosure, two ends of the vertical connection part are respectively connected with the two vertical conductive parts adjacent in the second direction through a via hole connection structure, the plurality of pixel units comprise a first color pixel unit, a second color pixel unit and a third color pixel unit, and an orthographic projection of the via hole connection structure on the base substrate is at least partially overlapped with an orthographic projection of an effective display region of the third color pixel unit on the base substrate.

For example, in the array substrate provided by an embodiment of the present disclosure, a light transmittance of the third color pixel unit is lower than a light transmittance of the first color pixel unit and a light transmittance of the second color pixel unit.

For example, in the array substrate provided by an embodiment of the present disclosure, the first color pixel unit is configured to emit light of a first color, the second color pixel unit is configured to emit light of a second color, and the third color pixel unit is configured to emit light of a third color, and a wavelength of the third color is smaller than a wavelength of the first color and a wavelength of the second color.

For example, in the array substrate provided by an embodiment of the present disclosure, each of the pixel units further comprises: a pixel electrode, located on a side of a film layer where the data lines are located away from the base substrate; and a common electrode, located on a side of the pixel electrode away from the base substrate, the vertical connection part is arranged on a same layer as the common electrode.

For example, in the array substrate provided by an embodiment of the present disclosure, at least one of the pixel units further comprises: a driving transistor, comprising a gate electrode, a source electrode and a drain electrode, the gate electrode is connected with one of the gate lines, the pixel electrode is connected with the drain electrode, the common electrode is connected with the common electrode line, the drain electrode comprises a drain body part and a drain extension part, the drain extension part extends from the drain body part to the vertical connection part, the pixel electrode comprises a pixel electrode extension part, and the pixel electrode extension part is connected with the drain electrode extension part by overlapping.

For example, in the array substrate provided by an embodiment of the present disclosure, an orthographic projection of the drain extension part on the base substrate and an orthographic projection of the vertical connection part on the base substrate are spaced apart, and a distance between the orthographic projection of the drain extension part on the base substrate and the orthographic projection of the vertical connection part on the base substrate is in the range of 0 microns to 3 microns.

For example, in the array substrate provided by an embodiment of the present disclosure, the distance between the orthographic projection of the drain extension part on the base substrate and the orthographic projection of the vertical connection portion on the base substrate is in the range of 1 micron to 2.5 microns.

For example, in the array substrate provided by an embodiment of the present disclosure, each of the gate lines comprises a spacer support part, and a region where the spacer support part is located is configured to place a spacer, an orthographic projection of the spacer support part on the base substrate is located between an orthographic projection of an extension line of the vertical conductive part on the base substrate and an orthographic projection of a data line closest to the vertical conductive part on the base substrate.

For example, in the array substrate provided by an embodiment of the present disclosure, each of the gate lines comprises a spacer support part, and a region where the spacer support part is located is configured to place a spacer, an orthographic projection of the spacer support part on the base substrate is at least partially overlapped with an orthographic projection of an extension line of the vertical conductive part on the base substrate.

For example, in the array substrate provided by an embodiment of the present disclosure, two gate lines are arranged between two pixel columns adjacent in the second direction.

For example, in the array substrate provided by an embodiment of the present disclosure, each of the pixel rows comprises a plurality of pixel groups, and each of the pixel groups comprises a first color pixel unit, a second color pixel unit, and a third color pixel unit that are arranged in sequence, the plurality of pixel groups comprise a first pixel group and a second pixel group sequentially arranged along the first direction, the plurality of data lines comprise a first data line, a second data line, a third data line and a fourth data line that are arranged in sequence, the first data line is located on a side of the first color pixel unit away from the second color pixel unit in the first pixel group, the second data line is located between the second color pixel unit and the third color pixel unit in the first pixel group, the third data line is located between the first color pixel unit and the second color pixel unit in the second pixel group, and the fourth data line is located on a side of the third color pixel unit away from the second color pixel unit in the second pixel group.

For example, in the array substrate provided by an embodiment of the present disclosure, the vertical common electrode line comprises a first vertical conductive part, a second vertical conductive part and a third vertical conductive part, the first vertical conductive part, the second vertical conductive part and the third vertical conductive part are all arranged on a same layer as the gate lines, the first vertical conductive part is located between the first color pixel unit and the second color pixel unit in the first pixel group, the second vertical conductive part is located between the third color pixel unit in the first pixel group and the first color pixel unit in the second pixel group, the third vertical conductive part is located between the second color pixel unit and the third color pixel unit in the second pixel group, the first vertical conductive part, the second vertical conductive part and the third vertical conductive part are all located between two gate lines of the gate lines, and are respectively intersected with the horizontal common electrode line, and form three integrated cross-shaped conductive structures at intersection positions.

For example, in the array substrate provided by an embodiment of the present disclosure, the vertical common electrode line further comprises: a first vertical connection part, arranged on a different layer from the gate lines, and connecting two second vertical conductive parts adjacent in the second direction; and a second vertical connection part, arranged on a different layer from the gate lines, and connecting two third vertical conductive parts adjacent in the second direction.

For example, in the array substrate provided by an embodiment of the present disclosure, two ends of the first vertical connection part are respectively connected with the two second vertical conductive parts adjacent in the second direction through a first via hole connection structure, an orthographic projection of the first via hole connection structure on the base substrate is at least partially overlapped with an orthographic projection of an effective display region of the third color pixel unit the on the base substrate, two ends of the second vertical connection part are respectively connected with two third vertical conductive parts adjacent in the second direction through a second via hole connection structure, and an orthographic projection of the second via hole connection structure on the base substrate is at least partially overlapped with the orthographic projection of the effective display region of the third color pixel unit on the base substrate.

For example, in the array substrate provided by an embodiment of the present disclosure, each of the gate lines comprises a plurality of spacer support parts, a region where each of the spacer support parts is located is configured to place a spacer, the plurality of spacer support parts comprise a main spacer support part and an auxiliary spacer support part, an orthographic projection of the main spacer support part on the base substrate is located between an orthographic projection of the first vertical connection part on the base substrate and an orthographic projection of the data line closest to the first vertical connection portion on the base substrate, or the orthographic projection of the main spacer support part on the base substrate is located between an orthographic projection of the second vertical connection part on the base substrate and the orthographic projection of the data line closest to the second vertical connection part on the base substrate.

For example, in the array substrate provided by an embodiment of the present disclosure, one main spacer support part and one auxiliary spacer support part are respectively arranged on two sides of the first vertical connection part or the second vertical connection part in the first direction.

For example, in the array substrate provided by an embodiment of the present disclosure, the plurality of pixel rows comprise a first pixel row and a second pixel row that are sequentially arranged along the second direction, the plurality of gate lines comprise a first gate line, a second gate line, a third gate line and a fourth gate line arranged in sequence, the first gate line is located on a side of the second pixel row away from the first pixel row, the second gate line and the third gate line are located between the first pixel row and the second pixel row, the third gate line is located on a side of the second gate line away from the first gate line, and the fourth gate line is located on a side of the first pixel row away from the second pixel row.

For example, in the array substrate provided by an embodiment of the present disclosure, the first gate line is connected with the first color pixel unit in the first pixel group and the first color pixel unit in the second pixel group in the first pixel row, the second gate line is connected with the second color pixel unit in the first pixel group and the second color pixel unit in the second pixel group in the first pixel row, the third gate line is connected with the first color pixel unit in the first pixel group and the first color pixel unit in the second pixel group in the second pixel row, and the fourth gate line is connected with the second color pixel unit in the first pixel group and the second color pixel unit in the second pixel group in the second pixel row.

For example, in the array substrate provided by an embodiment of the present disclosure, the first gate line is also connected with the third color pixel unit in the second pixel group in the first pixel row, the second gate line is also connected with the third color pixel unit in the first pixel group in the first pixel row, the third gate line is also connected with the third color pixel unit in the second pixel group in the second pixel row, and the fourth gate line is also connected with the third color pixel unit in the first pixel group in the second pixel row.

At least one embodiment of the present disclosure further provides a display panel, which includes the array substrate as mentioned above.

For example, in the display panel provided by an embodiment of the present disclosure, the display panel further includes an opposite substrate, arranged opposite to the array substrate; a main spacer, located between the array substrate and the opposite substrate; and an auxiliary spacer, located between the array substrate and the opposite substrate.

For example, in the display panel provided by an embodiment of the present disclosure, one main spacer is arranged for every N pixel units, a value range of N is from 30 to 40.

For example, in the display panel provided by an embodiment of the present disclosure, the value of N is 36.

For example, in the display panel provided by an embodiment of the present disclosure, the main spacer is arranged in contact with both the array substrate and the opposite substrate, and the auxiliary spacer is arranged in contact with at least one of the array substrate and the opposite substrate.

For example, in the display panel provided by an embodiment of the present disclosure, the main spacer has a first height in a direction perpendicular to the base substrate, the auxiliary spacer has a second height in a direction perpendicular to the base substrate, the first height is greater than the second height, and a difference between the first height and the second height is in the range of 0.2 microns to 0.6 microns.

At least one embodiment of the present disclosure further provides a display device, which includes the display panel as described above.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

Figure 1:
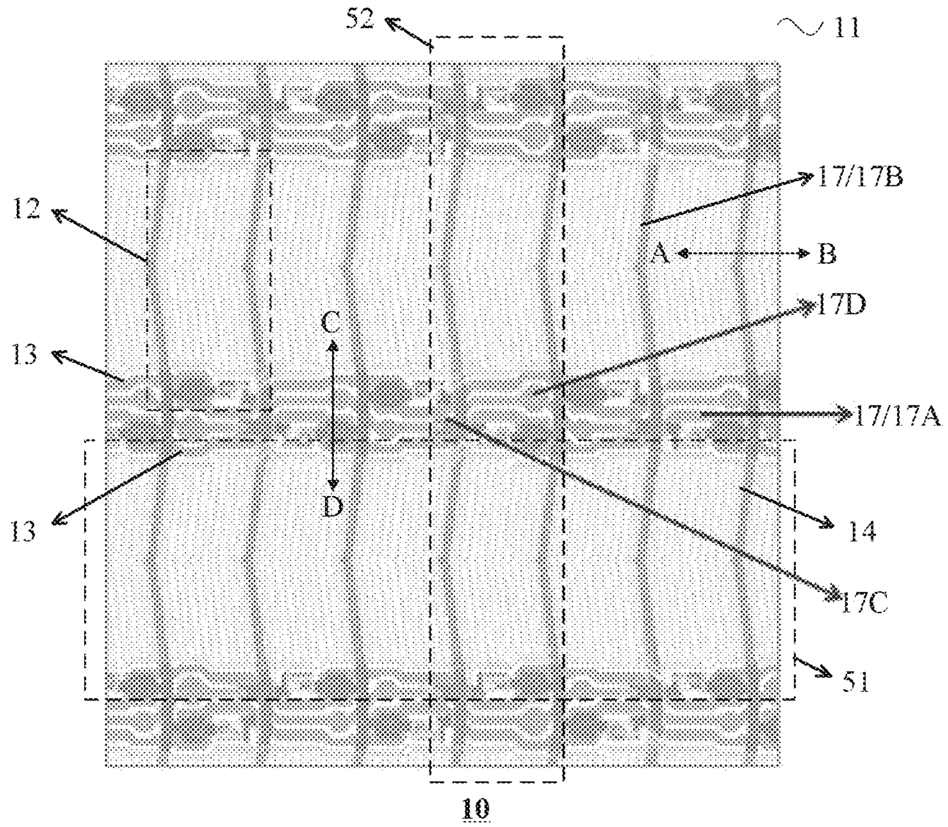
FIG. 1 is a planar schematic diagram of an array substrate in a liquid crystal panel.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising." "include," "including." etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Unless otherwise defined, features such as "parallel", "perpendicular" and "same" used in the embodiments of the present disclosure all include situations such as "parallel", "perpendicular", and "same" in the strict sense, and also include situations such as "approximately parallel", "approximately perpendicular", "approximately the same" that contain certain errors. For example, the above "approximately" may mean that difference of compared objects is within 10% of an average value of the compared objects, or within 5% of an average value of the compared objects. In a case that a number of components or elements is not specifically indicated below in the embodiments of the present disclosure, it refers to that the components or elements may be one or more, or may be understood as at least one. "At least one" means one or more, and "a plurality" means at least two. The "arranged on a same layer" in the embodiments of the present disclosure refers to a relationship between a plurality of film layers formed by a same material after going through a same step (for example, an one-step patterning process). The "same layer" here does not always refer to that the plurality of film layers have the same thickness or that the plurality of film layers have the same height in cross-sectional schematic diagrams.

Generally, a thin film transistor liquid crystal display device can use a black matrix formed on an opposite substrate to block a non-display region, so that occurrence of light leakage is avoided. In a liquid crystal display device, common electrodes cover data lines among adjacent pixel units, so that electric fields of the data lines can be shielded, and a dark region can be formed; therefore, a size of the black matrix above the data lines can be greatly reduced, so that an aperture ratio can be increased. However, because the common electrodes cover the data lines, parasitic capacitances formed among the common electrodes and the data lines are relatively large, impedances of the common electrodes or the common electrode line are relatively large, which leads to aggravated coupling of the common electrodes or the common electrode line, so that voltages of the common electrodes or the common electrode line recover slowly, and defects such as afterimages are caused.

Figure 2:
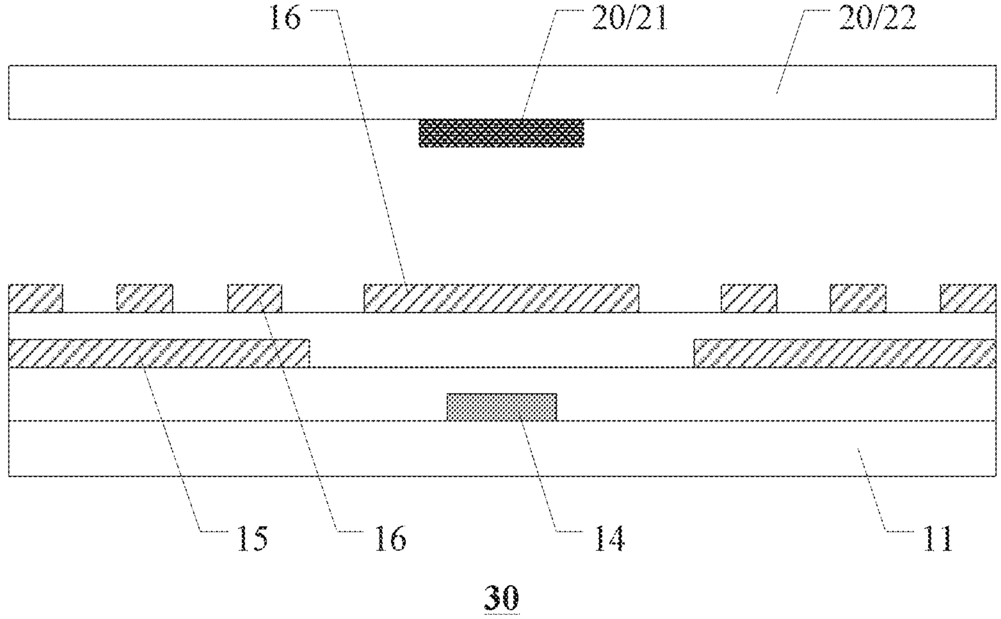
FIG. 2 is a cross-sectional schematic diagram of a liquid crystal panel along a direction AB in FIG. 1.
Figure 3:
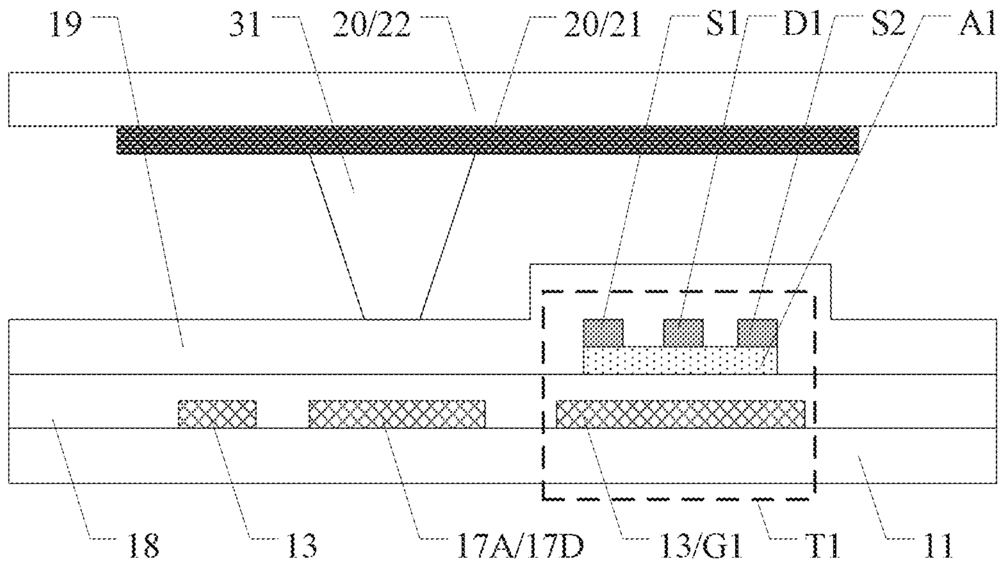
FIG. 3 is a cross-sectional schematic diagram of a liquid crystal panel along a direction CD in FIG. 1.

FIG. 1 is a planar schematic diagram of an array substrate in a liquid crystal panel; FIG. 2 is a cross-sectional schematic diagram of a liquid crystal panel along a direction AB in FIG. 1; and FIG. 3 is a cross-sectional schematic diagram of a liquid crystal panel along a direction CD in FIG. 1.

As illustrated by FIG. 1 and FIG. 2, the liquid crystal panel 40 includes an array substrate 10, the array substrate 10 includes a base substrate 11, a plurality of pixel units 12, gate lines 13, data lines 14, pixel electrodes 15, common electrodes 16 and a common electrode line 17. The plurality of pixel units 12 are arranged in an array along a first direction X and a second direction Y, and form a plurality of pixel rows 51 and a plurality of pixel columns 52; the plurality of pixel rows 51 are arranged along the second direction Y, and each of the plurality of pixel rows 51 extends along the first direction X; and the plurality of pixel columns 52 are arranged along the first direction X, and each of the plurality of pixel columns 52 extends along the second direction Y. Two gate lines 13 are arranged between two pixel rows 51 adjacent in the second direction Y, in the first direction X, one of the data lines 14 is arranged every two pixel columns 52.

As illustrated by FIG. 1 and FIG. 2, the liquid crystal panel 30 further includes an opposite substrate 20, the opposite substrate 20 is arranged at a distance from the array substrate 10; and the opposite substrate 20 includes a base substrate 22 and a black matrix 21 on the base substrate 22. The common electrodes 16 cover the data lines 14 among adjacent pixel units 12, so that the electric fields of the data lines 14 can be shielded and a dark region can be formed; therefore, a size of the black matrix 21 above the data line

14 can be greatly reduced, so that the aperture ratio can be increased. However, because the common electrodes 16 cover the data lines 14, and parasitic capacitances formed between the common electrodes 16 and the data lines 14 are relatively large, impedances on the common electrodes 16 or the common electrode line 17 are relatively large, resulting in increased coupling of the common electrodes 16 or the common electrode line 17, so that voltage recovery of the common electrodes 16 or the common electrode line 17 are relatively slow, resulting in defects such as afterimages.

As illustrated by FIG. 1 and FIG. 3, in order to reduce the coupling of the common electrodes 16 or the common electrode line 17, the common electrode line 17 is designed to include a horizontal common electrode line 17A and a vertical common electrode line 17B, the horizontal common electrode line 17A and the vertical common electrode line 17B can be electrically connected in an overlapping region 17C, so that the resistance of the common electrode line in the entire display panel can be reduced. Each of the horizontal common electrode line 17A is arranged between the two gate lines 13, thus the black matrix 21 arranged on the gate lines 13 needs to additionally cover the horizontal common electrode line 17A and intervals between the horizontal common electrode line 17A and two adjacent gate lines 13, so that the aperture ratio of the display panel is reduced.

On the other hand, as illustrated by FIG. 1 and FIG. 3, the display panel 30 further includes a driving transistor T1, a gate insulating layer 18, a passivation layer 19 and a spacer 31; the driving transistor T1 includes a gate electrode G1, an active layer A1, a first source electrode S1, a second source electrode S2 and a drain electrode D1; the gate insulating layer 18 is arranged between the gate electrode G1 and the active layer A1, and the passivation layer 19 is arranged on a side of the driving transistor T1 away from the base substrate 11. Due to the existence of the driving transistor T1, the passivation layer 19 will thus form a protruding structure. The data line 14 and the vertical common electrode line 17B are arranged between adjacent sub-pixel columns 52; because a thickness of the source-drain electrode layer where the data lines 14 and the vertical common electrode line 17B are located is relatively thick, similar to where the driving transistor T1 is located, the passivation layer 19 where the data lines 14 and the vertical common electrode line 17B are located also forms a protruding structure. Therefore, the flatness of the array substrate 10 at the positions where the data lines 14 and the vertical common electrode line 17B are located is relatively low.

As illustrated by FIG. 1 and FIG. 3, each of the horizontal common electrode line 17A includes a spacer support part 17D, a position of the spacer support part 17D is used to place a spacer 31, and the spacer 31 is used to maintain a cell thickness between the array substrate 10 and the opposite substrate 20. Therefore, the array substrate 10 needs to maintain a certain degree of flatness at a position where the spacer support part 17D is located, to prevent the spacer 31 from being displaced, so that defects such as uneven dark state caused by the displacement of the spacer are avoided. As mentioned above, the passivation layer 19 will form protruding structures at the positions where the driving transistors T1, the data lines 14 and the vertical common electrode line 17B are located, thus the spacer support parts 17D need to be manufactured away from the vertical common electrode line 17B and the data lines 14, so that it is needed to occupy the space of the effective display region, and the aperture ratio is reduced. It should be noted that, in a common array substrate, the passivation layer may also include other film layers, such as an alignment layer; for the sake of brevity, FIG. 3 does not show the film layer above the passivation layer; it can be understood that in a case that the array substrate includes other film layers mentioned above, because the passivation layer forms the protruding structures, a surface of the finally formed array substrate close to the opposite substrate will correspondingly form the protruding structures.

In this regard, embodiments of the present disclosure provide an array substrate, a display panel, and a display device. The array substrate includes a base substrate, a plurality of pixel units and a common electrode line; the plurality of pixel units are located on a side of the base substrate; the common electrode line includes a horizontal common electrode line and a vertical common electrode line, the horizontal common electrode line is electrically connected with the vertical common electrode line; the plurality of pixel units are arranged in an array along the first direction and the second direction to form a plurality of pixel rows and a plurality of pixel columns, each of the plurality of pixel rows extends along the first direction, and each of the plurality of pixel columns extends along the second direction; the horizontal common electrode line extends along the first direction, and the vertical common electrode line extends along the second direction, each of the pixel units includes an effective display region, the horizontal common electrode line is overlapped with a plurality of effective display regions of the same pixel row. In the array substrate, the horizontal common electrode line is overlapped with a plurality of effective display regions of the same pixel row, and is not arranged in a region outside the plurality of effective display regions to be covered by the black matrix; although the horizontal common electrode line itself will block light from the effective display regions, the black matrix does not need to cover the horizontal common electrode line and the intervals between the horizontal common electrode line and the adjacent gate lines, so that a width of the black matrix is reduced, and the aperture ratio of the display panel adopting the array substrate is effectively increased.

Hereinafter, the array substrate, the display panel and the display device provided by the embodiments of the present invention will be described in detail with reference to the accompanying drawings.

Figure 4:
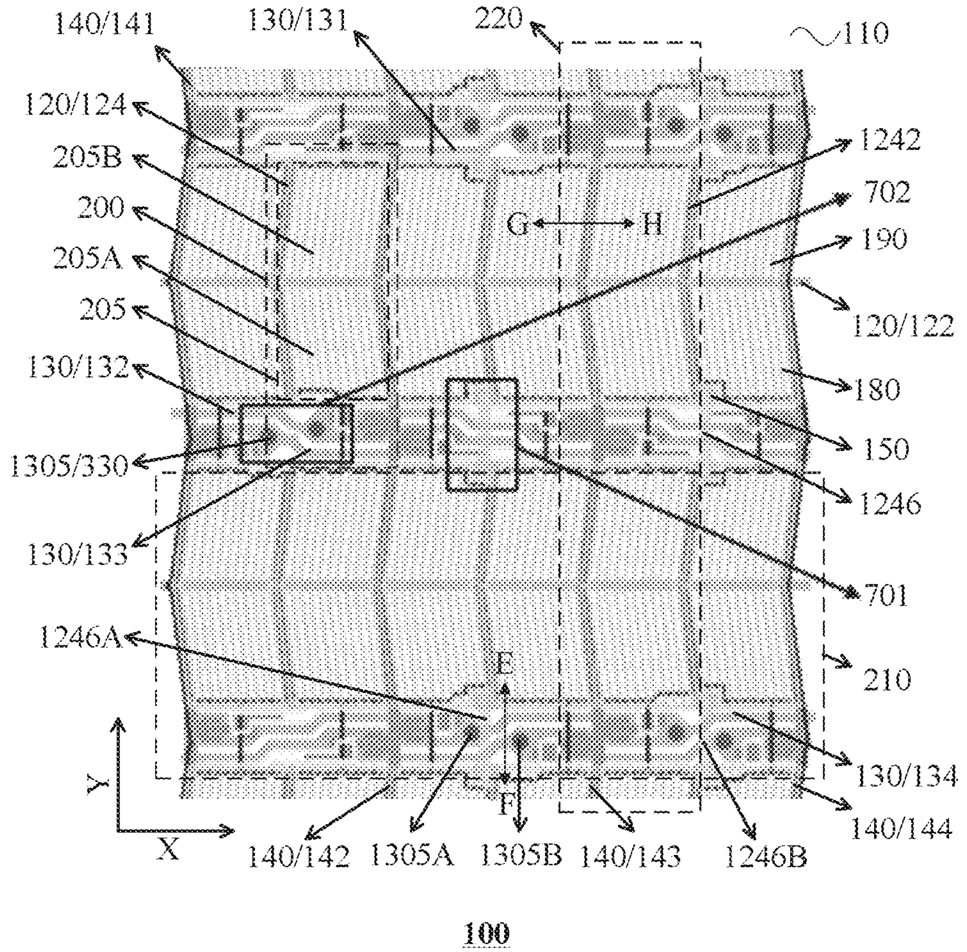
FIG. 4 is a planar schematic diagram of an array substrate provided by an embodiment of the present disclosure.
Figure 5:
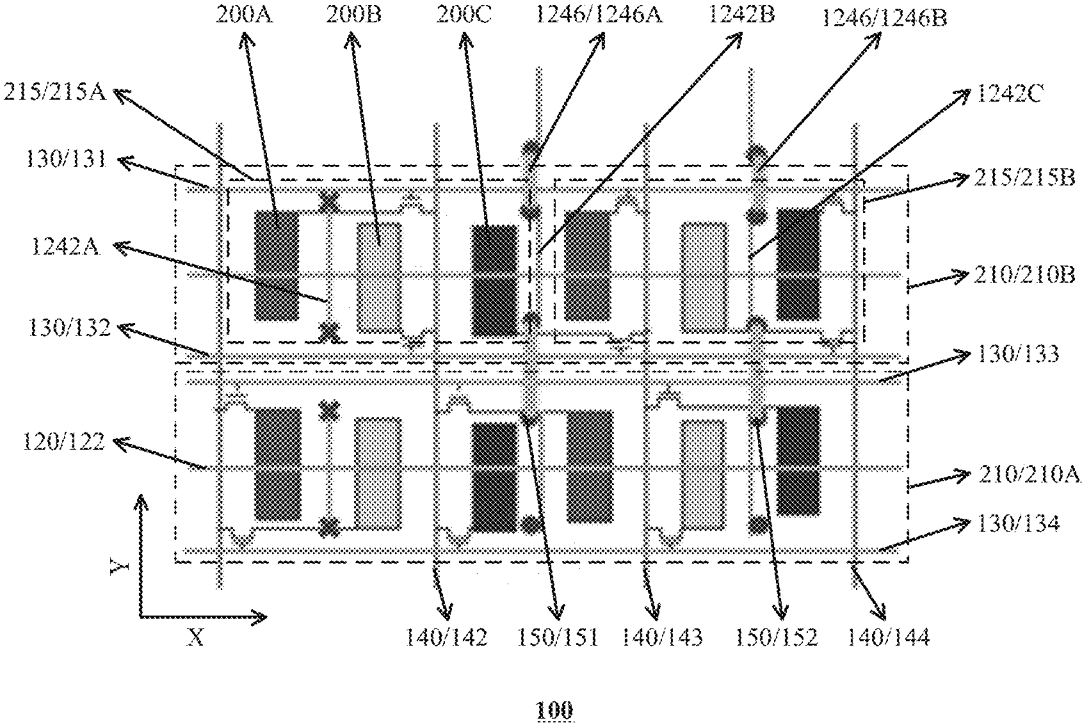
FIG. 5 is a schematic diagram of a connection relationship of components in an array substrate provided by an embodiment of the present disclosure.
Figure 6:
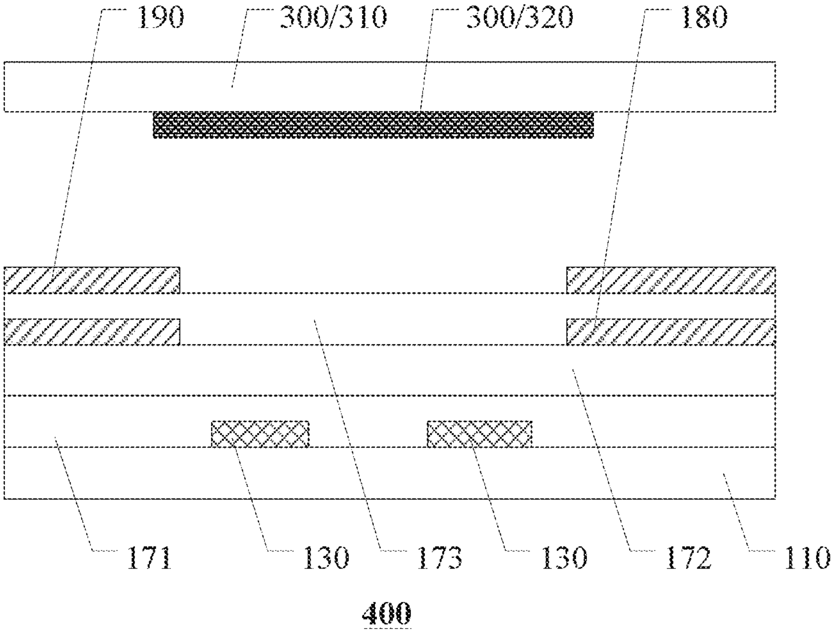
FIG. 6 is a cross-sectional schematic diagram of a display panel along a direction EF in FIG. 4 according to an embodiment of the present disclosure.
Figure 7:
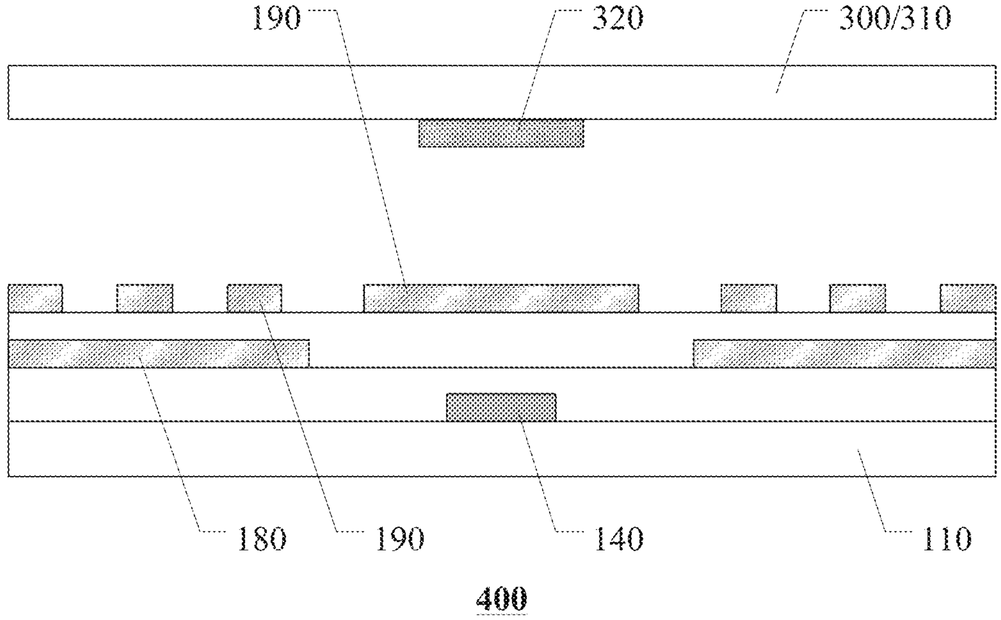
FIG. 7 is a cross-sectional schematic diagram of a display panel along a direction GH in FIG. 4 according to an embodiment of the present disclosure.

An embodiment of the present disclosure provides an array substrate. FIG. 4 is a planar schematic diagram of an array substrate provided by an embodiment of the present disclosure; FIG. 5 is a schematic diagram of a connection relationship of components in an array substrate provided by an embodiment of the present disclosure; FIG. 6 is a cross-sectional schematic diagram of a display panel along a direction EF in FIG. 4 according to an embodiment of the present disclosure; and FIG. 7 is a cross-sectional schematic diagram of a display panel along a direction GH in FIG. 4 according to an embodiment of the present disclosure. The display panels shown in FIG. 6 and FIG. 7 use the array substrate shown in FIG. 4.

As illustrated by FIGS. 4 and 5, the array substrate 100 includes a base substrate 110, a plurality of pixel units 200 and a common electrode line 120; the plurality of pixel units 200 are located on a side of the base substrate 110; the common electrode line 120 includes a horizontal common electrode line 122 and a vertical common electrode line 124, the horizontal common electrode line 122 is electrically connected with the vertical common electrode line 124, so that resistance of the common electrode line 122 can be reduced. It should be noted that the aforementioned pixel units may be sub-pixels emitting monochromatic light.

As illustrated by FIG. 4 and FIG. 5, the plurality of pixel units 200 are arranged along a first direction X and a second direction Y in an array to form a plurality of pixel rows 210 and a plurality of pixel columns 220, each of the plurality of pixel rows 210 extends along the first direction X, and each of the plurality of pixel columns 220 extends along the second direction Y; the horizontal common electrode line 122 extends along the first direction X, and the vertical common electrode line 124 extends along the second direction Y, each of the pixel units 200 includes an effective display region 205, the horizontal common electrode line 122 is overlapped with a plurality of effective display regions 205 of the same pixel row 210.

In the array substrate provided by the embodiments of the present disclosure, the horizontal common electrode line is overlapped with the plurality of effective display regions of the same pixel row, and is not arranged in a region outside the effective display regions that needs to be covered by the black matrix; although the horizontal common electrode line itself will block light from the effective display regions, the black matrix does not need to cover the horizontal common electrode line and the interval between the horizontal common electrode line and the adjacent gate lines, so that the width of the black matrix is reduced, and the aperture ratio of the display panel adopting the array substrate is effectively increased.

It should be noted that, in a common array substrate, in a case that a ratio of an area of the horizontal common electrode line to an area of the array substrate is a, and a ratio of an interval between the horizontal common electrode line and adjacent gate lines to an area of the array substrate is b, in addition to structures such as gate lines and driving transistors, the black matrix also needs to cover the horizontal common electrode line and interval between the horizontal common electrode line and adjacent gate lines, thus a ratio of an area of the black matrix to an area of the array substrate is x+a+b or x+a+2b (a dual gate driving structure), the above x is a ratio of an area of other components to be covered by the black matrix to the area of the array substrate. However, in the array substrate provided by the embodiments of the present disclosure, because the horizontal common electrode line is overlapped with the plurality of effective display regions of the same pixel row, and is not arranged in a region outside the effective display regions to be covered by the black matrix; although the ratio of the area of the horizontal common electrode line to the area of the array substrate is a, however, the ratio of the area of the black matrix to the area of the array substrate is reduced by a+b or a+2b (a dual gate driving structure). It can be seen that the aperture ratio of the display panel adopting the array substrate can be increased by b or 2b, thus the array substrate can effectively increase the aperture ratio of a display panel adopting the array substrate.

For example, as illustrated by FIG. 4 and FIG. 6, the array substrate of the display panel 400 adopts the above-mentioned array substrate 100; in this case, the display panel 400 further includes an opposite substrate 300, and the opposite substrate 300 includes a base substrate 310 and a black matrix 320 on the base substrate 310. It can be seen that because the horizontal common electrode line 122 is overlapped with a plurality of effective display regions 205 of the same pixel row 210, the black matrix 320 does not need to cover the horizontal common electrode line 122 and the interval between the horizontal common electrode line 122 and the gate lines 130. Therefore, the array substrate can effectively increase the aperture ratio of the display panel adopting the array substrate.

In some examples, as illustrated by FIG. 6, the array substrate 100 further includes a gate insulating layer 171, a passivation layer 172 and an insulating layer 173; the gate insulating layer 171 is located on a side of a film layer where a vertical conductive part 1242 is located away from the base substrate 110; the passivation layer 172 is located on a side of a film layer where the data lines 140 are located away from the base substrate 110; and the insulating layer 173 is located between the pixel electrode 180 and the common electrode 190.

In some examples, as illustrated by FIG. 4, the effective display region 205 of the pixel unit 200 includes a first domain 205A and a second domain 205B arranged in the second direction Y; the horizontal common electrode line 122 is located between the first domain 205A and the second domain 205B. In a case that the pixel unit 200 includes the first domain 205A and the second domain 205B, the region between the first domain 205A and the second domain 205B is generally a dark region (for example, light transmittance of the region between the first domain and the second domain is only from 20% to 30%); therefore, although the horizontal common electrode line is arranged between the first domain and the second domain, loss of light transmittance caused by the horizontal common electrode line is relatively low. In this way, the array substrate can greatly reduce adverse effect of arranging the horizontal common electrode line in the effective display regions.

Figure 8:
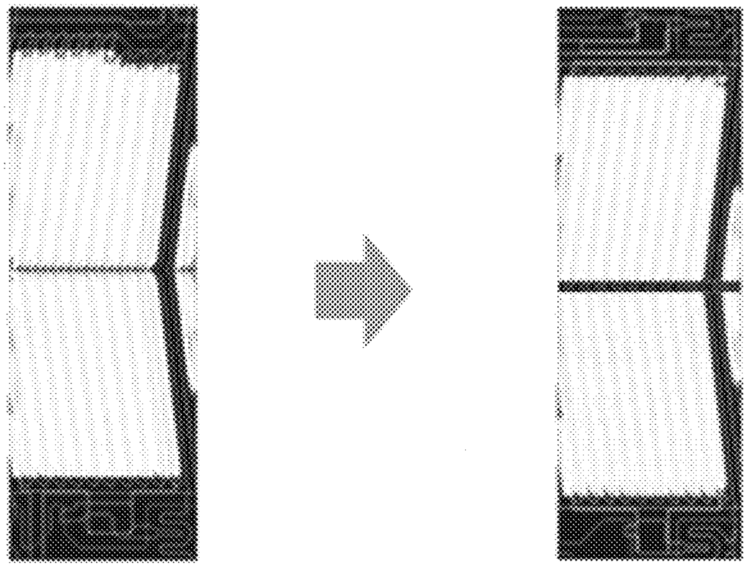
FIG. 8 is a comparison diagram of transmittance of an array substrate provided by an embodiment of the present disclosure.

FIG. 8 is a comparison diagram of transmittance of an array substrate provided by an embodiment of the present disclosure; As illustrated by FIG. 8, no horizontal common electrode line is provided between the first domain and the second domain of the array substrate on the left side, horizontal common electrode line is arranged between the first domain and the second domain of the array substrate on the right side; it can be seen that although the horizontal common electrode line is arranged between the first domain and the second domain, the loss of light transmittance caused by the horizontal common electrode line is relatively low.

In some examples, as illustrated by FIG. 4 and FIG. 7, each of the pixel units 200 includes a pixel electrode 180 and a common electrode 190; at least one of the pixel electrode 180 and the common electrode 190 is a slit electrode, that is, the slit electrode includes a plurality of slits or a plurality of electrode strips arranged at intervals. In the effective display region 205 of the display unit 200, the above-mentioned slits or electrode strips may have different extension directions in different regions, so that the liquid crystals in different regions have different orientations, and the viewing angle is increased. Therefore, the above-mentioned different regions are also the above-mentioned domains.

For example, a material of the pixel electrode 180 and the common electrode 190 can be transparent conductive oxide. For example: a combination or at least one of indium tin oxide (ITO), indium zinc oxide (IZO), zinc oxide (ZnO), indium oxide ($In_2O_3$), indium gallium oxide (IGO) and aluminum zinc oxide (AZO), and the embodiments of the present disclosure are not limited thereto.

For example, as illustrated by FIG. 4 and FIG. 7, an extending direction of a slit or an electrode strip included in the pixel electrode 180 located in the first domain 205A is different from an extending direction of a slit or an electrode strip included in a pixel electrode 180 located in the second domain 205B.

In some examples, as illustrated by FIG. 4 and FIG. 7, the common electrode 190 covers the data line 140 between adjacent pixel units 200, that is, an orthographic projection of the common electrode 190 on the base substrate 110 covers an orthographic projection of the data line 140 between adjacent pixel units 200 on the base substrate 110. In this way, the common electrode 190 can shield the electric field of the data lines 140 and form a dark region; therefore, the size of the black matrix 320 above the data lines 140 can be greatly reduced, so that the aperture ratio can be increased.

In some examples, as illustrated by FIG. 4 and FIG. 5, the array substrate 100 further includes a plurality of gate lines 130 and a plurality of data lines 140; the plurality of gate lines 130 are arranged along the second direction Y; the plurality of data lines 140 are arranged along the first direction X; each of the plurality of gate lines 130 extends along the first direction X, and each of the plurality of data lines 140 extends along the second direction Y; the plurality of gate lines 130 and the plurality of data lines 140 are arranged in different layers, and the horizontal common electrode line 122 are arranged on a same layer as the gate lines 130. In this way, the horizontal common electrode line extending along the first direction and the data lines extending along the second direction Y are arranged in different layers, and in this way, one of the horizontal common electrode line can be overlapped with a plurality of effective display regions of the same pixel row.

For example, the gate lines, the data lines and the common electrode line are opaque metal lines. For example, the materials of the gate lines, the data lines and the common electrode line may be any one or an alloy of at least two of copper, aluminum, tungsten, titanium, molybdenum, niobium and cobalt, and the embodiments of the present disclosure are not limited thereto.

For example, the gate line can be a single-layer or multi-layer structure, for example, the gate line can be a single-layer copper line, or a three-layer structure of molybdenum-niobium/copper/molybdenum-niobium, and the embodiments of the present disclosure are not limited thereto.

In some examples, as illustrated by FIG. 4 and FIG. 5, the vertical common electrode line 124 includes a vertical conductive part 1242, the vertical conductive part 1242 is arranged on a same layer as the gate lines 130, and the vertical conductive part 1242 is located between two pixel units 200 adjacent in the first direction X; the vertical conductive part 1242 is located between two gate lines 130, that is, the vertical conductive parts 1242 arranged on the same layer as the gate lines 130 are not connected with the gate lines 130, and the vertical conductive parts 1242 is arranged at intervals with the gate lines 130 are arranged at intervals. The vertical conductive part 1242 is intersected with the horizontal common electrode line 122 and form an integrated cross-shaped conductive structure at the intersection position. In this way, the array substrate can reduce the resistance of the common electrode line through the above-mentioned cross-shaped conductive structures.

In some examples, as illustrated by FIG. 4 and FIG. 5, the vertical conductive part 1242 is located between two data lines 140 adjacent in the second direction Y, an orthographic projection of the vertical conductive part 1242 on the base substrate 110 is spaced apart from orthographic projections of the data lines 140 on the base substrate 110. Although the vertical conductive part and the data lines are arranged in different layers, the array substrate can avoid formation of parasitic capacitances between the vertical conductive part and the data lines by arranging the vertical conductive part between two adjacent data lines.

In some examples, as illustrated by FIG. 4 and FIG. 5, the vertical common electrode line 124 includes a vertical connection part 1246, and the vertical connection part 1246 is arranged on a different layer from the gate lines 130, and the vertical connection part 1246 connects two vertical conductive parts 1242 adjacent in the second direction Y. In this way, on the one hand, the array substrate can reduce the resistance of the common electrode line through the vertical connection part; on the other hand, the array substrate can make the common electrode line form a mesh structure through the vertical connection part, so that the voltage uniformity and stability of the common electrodes or the common electrode line of the entire array substrate are increased.

In some examples, as illustrated by FIG. 4 and FIG. 5, two ends of the vertical connection part 1246 is respectively connected with two vertical conductive parts 1242 adjacent in the second direction Y through a via hole connection structure 150; the plurality of pixel units 200 include a first color pixel unit 200A, a second color pixel unit 200B and a third color pixel unit 200C, an orthographic projection of the via hole connection structure 150 on the base substrate 110 is at least partially overlapped with an orthographic projection of the effective display region of the third color pixel unit 200C on the base substrate 110. because the via hole connection structure may cause loss of aperture ratio, by arranging at least part of the via hole connection structure in the pixel unit with low light transmittance, the array substrate can reduce the loss of aperture ratio caused by the via hole connection structure.

It should be noted that each of the above-mentioned via hole connection structure may include a via hole in an insulating layer between two conductive structures arranged in different layers and a connection structure electrically connecting the two conductive structures in the via hole. In addition, although the centers of the pixel units located in the same row as illustrated by FIG. 5 are not located on the same straight line, the centers of the pixel units in the same row provided by the embodiments of the present disclosure may be located on a same straight line.

In some examples, as illustrated by FIG. 4 and FIG. 5, the light transmittance of the third color pixel units 200C is smaller than the light transmittance of the first color pixel units 200A and the light transmittance of the second color pixel units 200B.

In some examples, as illustrated by FIG. 4 and FIG. 5, the first color pixel unit 200A is configured to emit light of a first color, the second color pixel unit 200B is configured to emit light of a second color, and the third color pixel unit 200C is configured to emit light of a third color, the wavelength of the third color is smaller than the wavelength of the first color and the wavelength of the second color.

For example, the first color may be red, the second color may be green, and the third color may be blue. Of course, embodiments of the present disclosure include but are not limited thereto.

Figure 9:
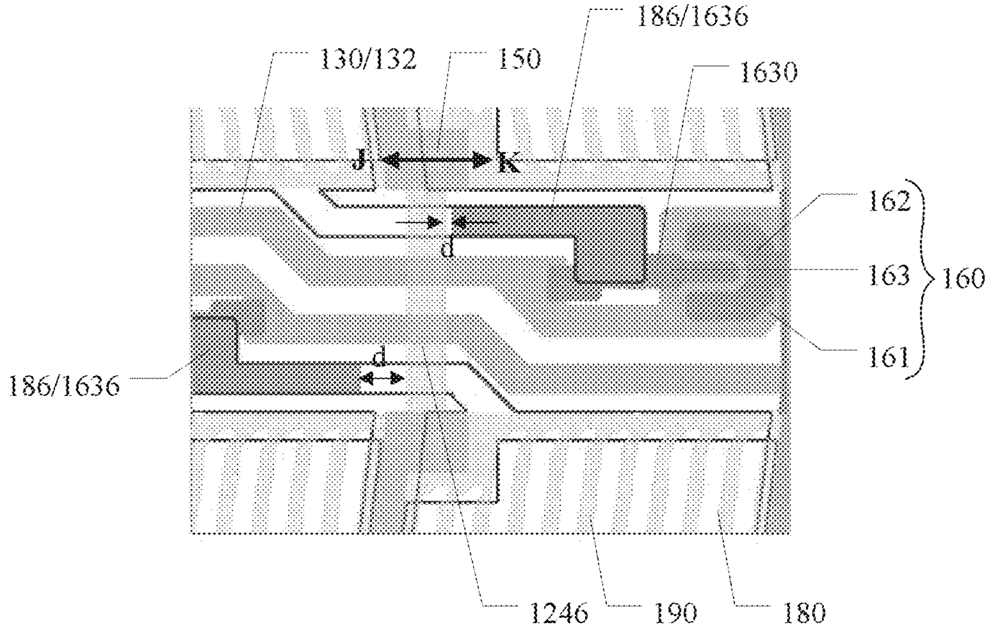
FIG. 9 is an enlarged schematic diagram of an array substrate provided by an embodiment of the present disclosure in a region indicated by a box 701 in FIG. 4.

FIG. 9 is an enlarged schematic diagram of an array substrate provided by an embodiment of the present disclosure in a region indicated by a box 701 in FIG. 4. As illustrated by FIG. 4, FIG. 5 and FIG. 9, each of the pixel units 200 further includes a pixel electrode 180 and a common electrode 190; the pixel electrode 180 is located on a side of a film layer where the data lines 140 are located away from the base substrate 110; the common electrode 190 is located on a side of the pixel electrode 180 away from the base substrate 110, and the vertical connection part 1246 is arranged on a same layer as the common electrode 190. That is, the vertical connection part 1246 can be made of a conductive material layer used to manufacture the common electrode 190. Of course, the embodiments of the present disclosure include but are not limited thereto, and the vertical connection part may also be made of other conductive material layers.

In some examples, as illustrated by FIG. 9, the vertical connection part 1246 may be integrally formed with the common electrode 190. That is, the vertical connection part and the common electrode can be manufactured by using a same conductive layer through a same mask process.

In some examples, as illustrated by FIG. 9, at least one pixel unit 200 further includes a driving transistor 160, a pixel electrode 180 and a common electrode 190; the driving transistor 160 includes a gate electrode 161, a source electrode 162 and a drain electrode 163, the gate electrode 161 is connected with a gate line 130, the pixel electrode 180 is connected with the drain electrode 163, and the common electrode 190 is connected with the common electrode line 120. The drain electrode 163 includes a drain body part 1630 and a drain extension part 1636, the drain extension part 1636 extends from the drain body part 1630 to the vertical connection part 1246; the pixel electrode 180 includes a pixel electrode extension part 186, and the pixel electrode extension part 186 is connected with the drain extension part 1636 by overlapping. On the one hand, the drain extension part can reduce resistance of the pixel electrode extension part; on the other hand, the pixel electrode is connected with the drain electrode through the pixel electrode extension part by overlapping, which avoids setting a via hole connection structure between the pixel electrode and the drain electrode in a straight line, so that the aperture ratio can be further increased.

In some examples, as illustrated by FIG. 9, an orthographic projection of the drain extension part 1636 on the base substrate 110 is spaced apart from an orthographic projection of the vertical connection part 1246 on the base substrate 110, and a distance d between the orthographic projection of the drain extension part 1636 on the base substrate 110 and the orthographic projection of the vertical connection part 1246 on the base substrate 110 is in the range of 0 μm to 3 μm. In this way, on a premise of ensuring that an overlapping region of the drain extension part and the pixel electrode extension part is large enough, the overlapping of the drain extension part and the vertical connection part is avoided.

In some examples, as illustrated by FIG. 9, the distance d between the orthographic projection of the drain extension part 1636 on the base substrate 110 and the orthographic projection of the vertical connection part 1246 on the base substrate 110 ranges from 1 micron to 2.5 microns, such as 2.1 microns.

In some examples, as illustrated by FIG. 9, an overlapping area of the pixel electrode extension part 186 and the drain extension part 1636 is greater than 50% of an area of the pixel electrode extension part 186, so that the resistance of the pixel electrode extension part 186 can be effectively reduced.

Figure 10A:
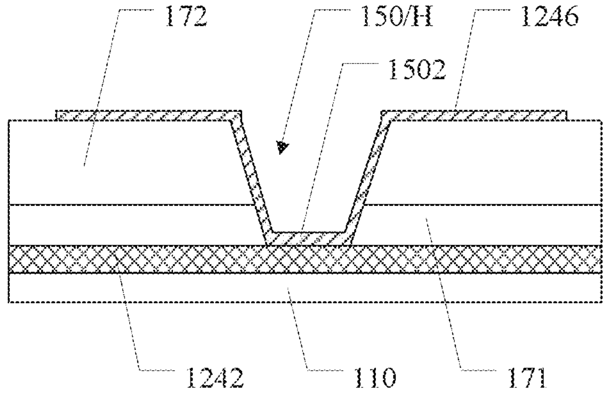
FIG. 10A is a cross-sectional schematic diagram of an array substrate along a direction JK in FIG. 9 provided by an embodiment of the present disclosure.

FIG. 10A is a cross-sectional schematic diagram of an array substrate along a direction JK in FIG. 9 provided by an embodiment of the present disclosure. As illustrated by FIG. 10A, the array substrate 100 further includes a gate insulating layer 171 and a passivation layer 172; the gate insulating layer 171 is located on a side of the film layer where the vertical conductive part 1242 is located away from the base substrate 110; and the passivation layer 172 is located on a side of the film layer where the data lines 140 are located away from the base substrate 110. The via hole connection structure 150 may include a via hole H located in the gate insulating layer 171 and the passivation layer 172 and a conductive structure 1502 located in the via hole H, and the conductive structure 1502 can be a part of the vertical connection part 1246.

Figure 10B:
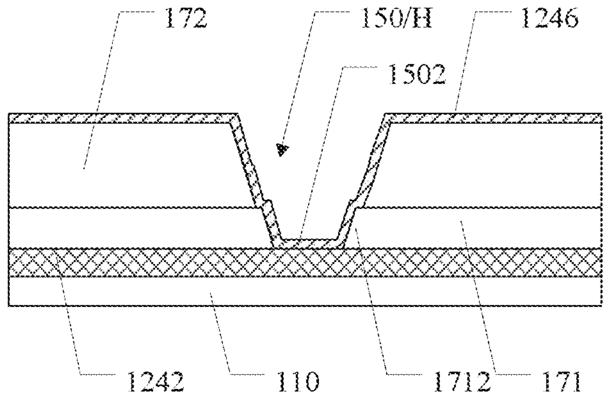
FIG. 10B is a cross-sectional schematic diagram of another array substrate along the direction JK in FIG. 9 provided by an embodiment of the present disclosure.

FIG. 10B is a cross-sectional schematic diagram of another array substrate along a direction JK in FIG. 9 provided by an embodiment of the present disclosure. As illustrated by FIG. 10B, in a case that the gate insulating layer 171 and the passivation layer 172 are made of different materials, the gate insulating layer 171 and the passivation layer 172 have different etching rates; in this case, the gate insulating layer 171 forms a stepped part 1712 facing the via hole H; and a part of the conductive structure 1502 is located on the stepped part 1712.

Figure 11:
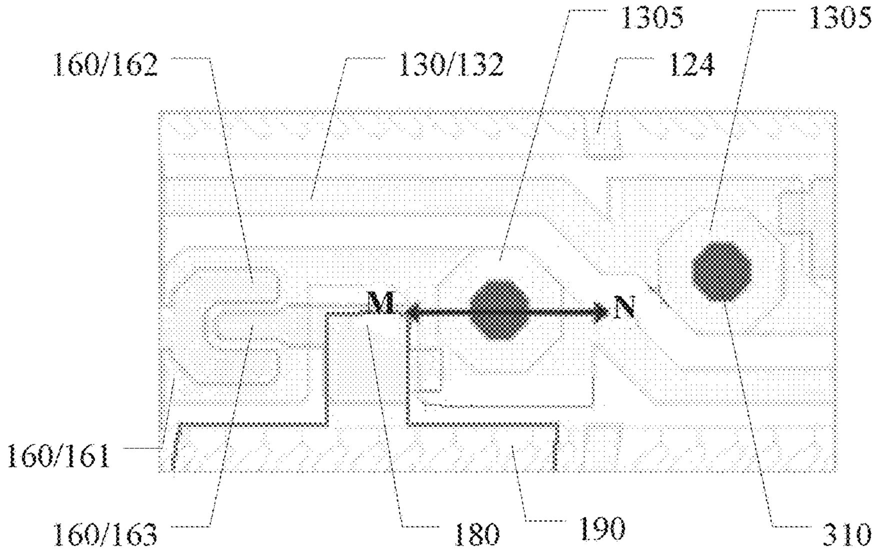
FIG. 11 is an enlarged schematic diagram of an array substrate provided by an embodiment of the present disclosure in a region indicated by a box 702 in FIG. 4.
Figure 12:
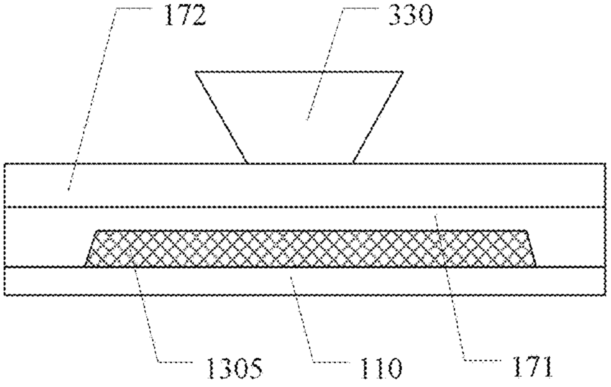
FIG. 12 is a cross-sectional schematic diagram of an array substrate along a direction MN in FIG. 11 provided by an embodiment of the present disclosure.

FIG. 11 is an enlarged schematic diagram of an array substrate provided by an embodiment of the present disclosure in a region indicated by a box 702 in FIG. 4; FIG. 12 is a cross-sectional schematic diagram of an array substrate along a direction MN in FIG. 11 provided by an embodiment of the present disclosure. As illustrated by FIG. 4 and FIG. 11, each of the gate lines 130 includes a spacer support part 1305, a region where the spacer support part 1305 is located is configured to place a spacer 330; an orthographic projection of the spacer support part 1305 on the base substrate 110 is located between an orthographic projection of an extension line of the vertical conductive part 1242 on the base substrate 110 and an orthographic projection of a data line 140 closest to the vertical conductive part 1242 on the base substrate 110. Because the vertical conductive part does not pass through the gate lines, no vertical common electrode line or data line is provided at the positions of the extension line of the vertical conductive part, which are relatively flat; the spacer support part does not need to avoid this region. In this way, the spacer support part does not occupy the effective display regions of the pixel units, so that the aperture ratio can be increased. Of course, the embodiments of the present disclosure include but are not limited thereto, orthographic projections of the spacer support parts on the base substrate are at least partially overlapped with orthographic projection of the extension line of the vertical conductive part on the base substrate, so that the region where the extension line of the vertical conductive part is located can be better utilized.

In some examples, as illustrated by FIG. 4 and FIG. 11, each of the pixel units 200 includes a driving transistor 160, a pixel electrode 180 and a common electrode 190; the driving transistor 160 includes a gate electrode 161, a source electrode 162 and a drain electrode 163, the gate electrode 161 is connected with one of the gate lines 130, the pixel electrode 180 is connected to the drain electrode 163, the common electrode 190 is connected with a common electrode line 120, the pixel electrode 180 is connected with the drain electrode 163 by overlapping. In this way, the array substrate does not need to be arranged with a via hole connection structure connecting the pixel electrode and the drain electrode, so that the aperture ratio can be further increased.

In the embodiment of the present disclosure, in a case that the array substrate adopts a related design of the above-mentioned common electrode line, the aperture ratio of the display panel adopting the array substrate can be increased by about 7%; in the case that the array substrate adopts a related design of the above-mentioned spacer support part, the aperture ratio of the display panel adopting the array substrate can be increased by about 3%; and in a case that the array substrate adopts the above-mentioned design in which the pixel electrode and the drain electrode are connected by overlapping, the aperture ratio of the display panel adopting the array substrate can be increased by about 2%. Therefore, in the case that the array substrate adopts a combination of the above-mentioned various designs, the aperture ratio of the display panel adopting the array substrate can be increased by more than 12%, and the array substrate has better effect.

In some examples, the aforementioned base substrate 110 may be a glass substrate, a plastic substrate or a quartz substrate. Of course, the embodiments of the present disclosure include but are not limited thereto, and the material of the base substrate may also be polyimide or the like.

In some examples, the above-mentioned gate insulating layer 171 may be made of an inorganic material or an organic material. The inorganic material may include one or more selected from silicon nitride (SiNx), silicon oxide (SiOx), and silicon oxynitride (SiNxOy). The organic material may include acrylic resin or polyimide resin.

In some examples, the above-mentioned material of the passivation layer 172 may be an inorganic material or an organic material. The inorganic material may include one or more selected from silicon nitride (SiNx), silicon oxide (SiOx), and silicon oxynitride (SiNxOy). The organic material may include acrylic resin or polyimide resin.

In some examples, the above-mentioned insulating layer 173 may be made of an inorganic material or an organic material. The inorganic material may include one or more selected from silicon nitride (SiNx), silicon oxide (SiOx), and silicon oxynitride (SiNxOy). The organic material may include acrylic resin or polyimide resin.

In some examples, as illustrated by FIG. 4 and FIG. 5, the array substrate 100 includes a base substrate 110, a plurality of gate lines 130, a plurality of data lines 140, a plurality of pixel units 200 and a common electrode line 120; the plurality of pixel units 200 are located on a side of the base substrate 110; the plurality of pixel units 200 are arranged in an array along the first direction X and the second direction Y to form a plurality of pixel rows 210 and a plurality of pixel columns 220, each of the plurality of pixel rows 210 extends along the first direction X, and each of the plurality of pixel columns 220 extends along the second direction Y. The plurality of gate lines 130 are arranged along the second direction Y; the plurality of data lines 140 are arranged along the first direction X; each of the plurality of gate lines 130 extends along the first direction X, and each of the plurality of data lines 140 extends along the second direction Y; the plurality of gate lines 130 and the plurality of data lines 140 are arranged in different layers.

As illustrated by FIG. 4 and FIG. 5, the common electrode line 120 includes a horizontal common electrode line 122 and a vertical common electrode line 124, the horizontal common electrode line 122 is electrically connected with the vertical common electrode line 124, so that the resistance of the common electrode line 122 can be reduced. The horizontal common electrode line 122 is arranged on the same layer as the gate lines 130 and extends along the first direction X, the vertical common electrode line 124 extends along the second direction Y, and each of the pixel units 200 includes an effective display region 205, and the horizontal common electrode line 122 is overlapped with the plurality of effective display regions 205 of the same pixel row 210.

In the array substrate provided by the embodiments of the present disclosure, the horizontal common electrode line is overlapped with the plurality of effective display regions of the same pixel row, and are not arranged in a region outside the effective display regions that needs to be covered by the black matrix; although the horizontal common electrode line itself will block the light from the effective display regions, the black matrix does not need to cover the horizontal common electrode line and the interval between the horizontal common electrode line and the adjacent gate lines, so that the width of the black matrix is reduced, and the aperture ratio of the display panel adopting the array substrate is effectively increased.

In some examples, as illustrated by FIG. 4 and FIG. 5, two gate lines 130 are arranged between two pixel columns 220 adjacent in the second direction Y. In this way, the array substrate adopts a double-gate driving mode, so that the number of data lines can be reduced.

In some examples, as illustrated by FIG. 4 and FIG. 5, each of the plurality of pixel rows 210 includes a plurality of pixel groups 215, each of the plurality of pixel groups 215 includes a first color pixel unit 200A, a second color pixel unit 200B and a third color pixel unit 200C arranged in sequence; the plurality of pixel groups 215 include a first pixel group 215A and a second pixel group 215B sequentially arranged along the first direction X, and the plurality of data lines 140 include a first data line 141, a second data line 142, a third data line 143 and a fourth data line 144 arranged in sequence.

In some examples, as illustrated by FIG. 4 and FIG. 5, the first data line 141 is located on the side of the first color pixel unit 200A away from the second color pixel unit 200B in the first pixel group 215A, the second data line 142 is located between the second color pixel unit 200B and the third color pixel unit 200C in the first pixel group 215A, the third data line 143 is located in the first color pixel unit 200A and the second color pixel unit 200B in the second pixel group 215B, and the fourth data line 144 is located on a side of the third color pixel unit 200C away from the second color pixel unit 200B in the second pixel group 215B.

In some examples, as illustrated by FIG. 4 and FIG. 5, each of the vertical common electrode line 124 includes a first vertical conductive part 1242A, a second vertical conductive part 1242B, and a third vertical conductive part 1242C, the first vertical conductive part 1242A, the second vertical conductive part 1242B and the third vertical conductive part 1242C are all arranged on the same layer as the gate lines 130. The first vertical conductive part 1242A is located between the first color pixel unit 200A and the second color pixel unit 200B in the first pixel group 215A, the second vertical conductive part 1242B is located between the third color pixel unit 200C in the first pixel group 215A and the first color pixel unit 200A in the second pixel group 215B, the third vertical conductive part 1242C is located between the second color pixel unit 200B and the third color pixel unit 200C in the second pixel group 215B; the first vertical conductive part 1242A, the second vertical conductive part 1242B and the third vertical conductive part 1242C are all located between two gate lines 130, and are respectively intersected with the horizontal common electrode line 122, and three integrated cross-shaped conductive structures are formed at the intersection positions. In this way, the array substrate can reduce the resistance of the common electrode line through the above-mentioned cross-shaped conductive structure.

In some examples, as illustrated by FIG. 4 and FIG. 5, the light transmittance of the third color pixel unit 200C is smaller than the light transmittance of the first color pixel unit 200A and the light transmittance of the second color pixel unit 200B.

In some examples, as illustrated by FIG. 4 and FIG. 5, the first color pixel unit 200A is configured to emit light of a first color, the second color pixel unit 200B is configured to emit light of a second color, the third color pixel unit 200C is configured to emit light of a third color, the wavelength of the third color is smaller than the wavelength of the first color and the wavelength of the second color.

For example, the first color may be red, the second color may be green, and the third color may be blue. Of course, embodiments of the present disclosure include but are not limited thereto.

In some examples, as illustrated by FIG. 4 and FIG. 5, the vertical common electrode line 124 further includes a first vertical connection part 1246A and a second vertical connection part 1246B; the first vertical connection part 1246A is arranged on a different layer with the gate lines 130, and the first vertical connection part 1246A connects two second vertical conductive parts 1242B adjacent in the second direction Y; and the second vertical connection part 1246B is arranged on a different layer from the gate lines 130, and the second vertical connection part 1246B connects two third vertical conductive parts 1242C adjacent in the second direction Y.

In some examples, as illustrated by FIG. 4 and FIG. 5, two ends of the first vertical connection part 1246A are respectively connected with two second vertical conductive parts 1242B adjacent in the second direction Y through a first via hole connection structure 151; an orthographic projections of the first via hole connection structure 151 on the base substrate 110 are at least partially overlapped with an orthographic projection of the effective display region of the third color pixel unit 200C on the base substrate 110. because the first via hole connection structure may cause loss of aperture ratio, by arranging the first via hole connection structure at least partially in the pixel unit with low light transmittance, the array substrate can reduce the loss of aperture ratio caused by the first via hole connection structure.

In some examples, as illustrated by FIG. 4 and FIG. 5, two ends of the second vertical connection part 1246B are respectively connected with two third vertical conductive parts 1242C adjacent in the second direction Y through a second via hole connection structure 152; and an orthographic projection of the second via hole connection structure 152 on the base substrate 110 is at least partially overlapped with the orthographic projections of the effective display regions of the third color pixel units 200C on the base substrate 110.

In some examples, as illustrated by FIG. 4 and FIG. 5, each of the gate lines 130 includes a plurality of spacer support parts 1305, a region where each of the plurality of spacer support parts 1305 is located is configured to place a spacer, the plurality of spacer support parts 1305 include a main spacer support part 1305A and an auxiliary spacer support part 1305B; an orthographic projection of the main spacer support part 1305A on base substrate 110 is located between an orthographic projection of the first vertical connection part 1246A on the base substrate 110 and an orthographic projection of a data line 140 closest to the first vertical connection part 1246A on the base substrate 110; or the orthographic projection of the main spacer support part 1305A on the base substrate 110 is located between an orthographic projection of a second vertical connection part 1246B on the base substrate 110 and an orthographic projection of a data line 140 closest to the second vertical connection part 1246B on the base substrate 110.

In some examples, as illustrated by FIG. 4 and FIG. 5, one main spacer support part 1305A and one auxiliary spacer support part 1305B are arranged on two sides of the first vertical connection part 1246A or the second vertical connection part 1246B in the first direction, respectively.

It should be noted that, because only one main spacer support part needs to be arranged for every N (for example, N is from 30 to 40) pixel units, an orthographic projection of the auxiliary spacer support part on base substrate can also be set between an orthographic projection of the first vertical connection part on the base substrate and the orthographic projection of a data line closest to the first vertical connection part on the base substrate, or is located between the orthographic projection of the second vertical connection part on the base substrate and the orthographic projection of the data line closest to the second vertical connection part on the base substrate. Of course, the embodiments of the present disclosure include but are not limited thereto, the orthographic projections of the spacer support parts on the base substrate are at least partially overlapped with orthographic projections of extension lines of vertical conductive parts on the base substrate, or are located above the data lines.

Figure 13:
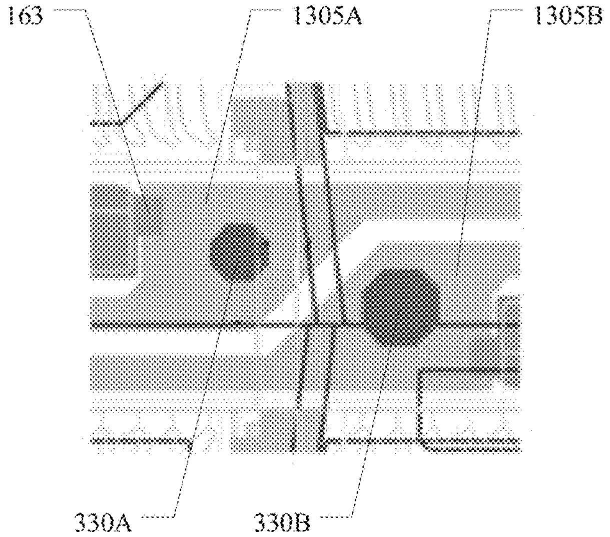
FIG. 13 is a positional relationship diagram between a spacer support part and a spacer provided by an embodiment of the present disclosure.

FIG. 13 is a positional relationship diagram between a spacer support part and a spacer provided by an embodiment of the present disclosure. As illustrated by FIG. 13, a main spacer 330A can be arranged on the main spacer support part 1305A, and an auxiliary spacer 330B can be arranged on the auxiliary spacer support part 1305B. A shortest distance between an edge of the orthographic projection of the main spacer 330A on the base substrate 110 and an edge of the orthographic projection of the main spacer support part 1305A on the base substrate is in the range of 5 μm to 7 μm, for example, 6.6 μm. In this way, because a flatness of a central part of the main spacer support part is greater than that of the edge part, the array substrate can avoid arranging the main spacer at the edge part of the main spacer support part, so that the stability of the main spacer can be improved.

In some examples, as illustrated by FIG. 13, a range of a shortest distance between an edge of the orthographic projection of the main spacer 330A on the base substrate 110 and an edge of the orthographic projection of the adjacent drain electrode 163 on the base substrate is from 10 microns to 12 microns, for example, 11.1 microns. Because the drain electrode has a great influence on the flatness, the array substrate can avoid arranging the main spacer away from the drain electrode, so that the stability of the main spacer can be improved.

In some examples, as illustrated by FIG. 4 and FIG. 5, an orthographic projection of a spacer support part 1305 on the base substrate 110 is located between an orthographic projection of an extension line of the first vertical conductive part 1242A on the base substrate 110 and an orthographic projection of a data line 140 closest to the first vertical conductive part 1242A on the base substrate 110. Because the second via hole connection structure may cause a loss of aperture ratio, by arranging the second via hole connection structure at least partially in the pixel unit with low light transmittance, the array substrate can reduce the loss of aperture ratio caused by the second via hole connection structures. Of course, the embodiments of the present disclosure include but are not limited thereto, the orthographic projection of the spacer support part on the base substrate is at least partially overlapped with the orthographic projection of the extension line of the vertical conductive part on the base substrate, so that a region where the extension line of the vertical conductive part is located can be better utilized.

On the other hand, two first vertical conductive parts adjacent in the second direction are not arranged with a vertical connection part, thus the region where the extension line of the first vertical conductive part is located is flatter, so that the spacer is less likely to be displaced.

In some examples, as illustrated by FIG. 4 and FIG. 5, each of the gate lines 130 includes a spacer support part 1305, a region where the spacer support part 1305 is located is configured to place a spacer 330, an orthographic projection of the spacer support part 1305 on the base substrate 110 is at least partially overlapped with the orthographic projection of the extension line of the first vertical conductive part 1242A on the base substrate 110.

In some examples, as illustrated by FIG. 4 and FIG. 5, the plurality of pixel rows 210 include a first pixel row 210A and a second pixel row 210B that are sequentially arranged along the second direction Y, the plurality of gate lines 130 include a first gate line 131, a second gate line 132, a third gate line 133 and a fourth gate line 134 arranged in sequence; the first gate line 131 is located on a side of a second pixel row 210B away from a first pixel row 210A, the second gate line 132 and the third gate line 133 are located between the first pixel row 210A and the second pixel row 210B, the third gate line 133 is located on a side of the second gate line 132 away from the first gate line 131, and the fourth gate line 134 is located on a side of the first pixel row 210A away from the second pixel row 210B.

In some examples, as illustrated by FIG. 4 and FIG. 5, the first gate line 131 is connected with the first color pixel unit 200A in the first pixel group 215A and the first color pixel unit 200A in the second pixel group 215B of the first pixel row 210A; the second gate line 132 is connected with the second color pixel unit 200B in the first pixel group 215A and the second color pixel unit 200C in the second pixel group 215B of the first pixel row 210A; the third gate line 133 is connected with the first color pixel unit 200A in the first pixel group 215A and the first color pixel unit 200A in the second pixel group 210B of the second pixel row 210B; and the fourth gate line 134 is connected with the second color pixel unit 200B in the first pixel group 215A and the second color pixel unit 200B in the second pixel group 215B of the second pixel row 210B. Usually, a brightness of the first color pixel unit and a brightness of the second color pixel unit are higher than the brightness of the third color pixel unit. In this way, the array substrate can realize that the plurality of first color pixel units in the same pixel row are all driven by the same gate line, so that charging rates of the plurality of first color pixel units can be guaranteed to be consistent, and defects such as fine lines are prevented from occurring. Similarly, the array substrate can realize that the plurality of second color pixel units in the same pixel row are all driven by the same gate line, so that charging rates of the plurality of second color pixel units can be guaranteed to be consistent, so that undesirable phenomena such as fine lines is prevented from occurring.

In some examples, as illustrated by FIG. 4 and FIG. 5, the first gate line 131 is also connected with third color pixel unit 200C in the second pixel group 215B in the first pixel row 210A, the second gate line 132 is also connected with third color pixel unit 200C in the first pixel group 215A in the first pixel row 210A, the third gate line 133 is also connected with the third color pixel unit 200C in the second pixel group 215B in the second pixel row 210B, and the fourth gate line 134 is also connected with the third color pixel unit 200C in the first pixel group 215A in the second pixel row 210B.

It should be noted that, the above-mentioned embodiments are described by taking the ADS and HADS modes as examples, but the embodiments of the present disclosure include but are not limited thereto, embodiments of the present disclosure may also be applicable to modes such as In-Plane Switching (IPS). In addition, the above-mentioned embodiments are described by taking linear horizontal common electrode line and vertical common electrode line as examples. However, the embodiments of the present disclosure are not limited thereto, and the common electrode line and the vertical common electrode line provided by the embodiments of the present disclosure may not be linear, as long as the horizontal common electrode line generally extend along the first direction and the vertical common electrode line generally extend along the column direction.

An embodiment of the present disclosure further provides a method for manufacturing an array substrate. FIGS. 14A to 14D are schematic diagrams of steps of a method for manufacturing an array substrate according to an embodiment of the present disclosure.

Figure 14A:
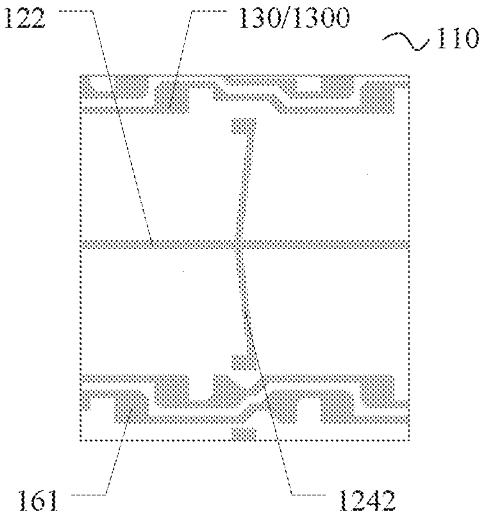
FIGS. 14A to 14D are schematic diagrams of steps of a method for manufacturing an array substrate provided by an embodiment of the present disclosure.

As illustrated by FIG. 14A, forming a gate layer 1300 on the base substrate 110; the gate layer 1300 includes the gate lines 130, the gate electrodes 161, the horizontal common electrode line 122, and the vertical conductive part 1242 of the vertical common electrode line mentioned above. The vertical conductive part 1242 is located between two gate lines 130, that is, the vertical conductive part 1242 arranged on the same layer as the gate lines 130 is not connected with the gate lines 130, and is arranged at intervals with the gate lines 130. The vertical conductive part 1242 is intersected with the horizontal common electrode line 122, and form an integrated cross-shaped conductive structure at the intersection position. In this way, the array substrate can reduce the resistance of the common electrode line through the above-mentioned cross-shaped conductive structure.

Figure 14B:
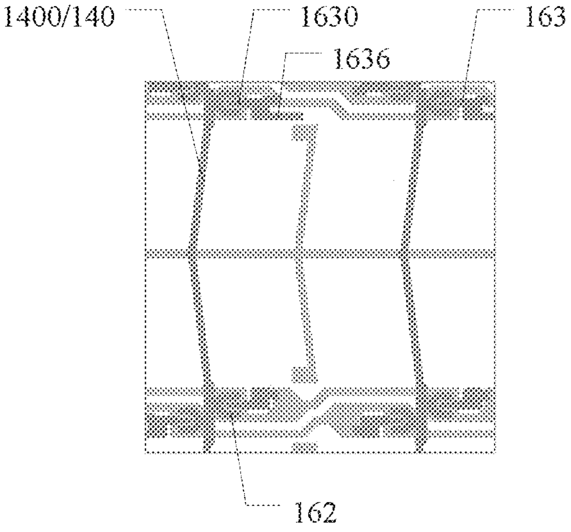

As illustrated by FIG. 14B, forming a source-drain electrode layer 1400 on a side of the gate layer 1300 away from the base substrate 110; the source-drain electrode layer 1400 includes the data lines 140, the source electrode 162 and the drain electrode 163 of the driving transistor 160 mentioned above. The vertical conductive part 1242 is located between two adjacent data lines 140, an orthographic projection of the vertical conductive part 1242 on the base substrate 110 is spaced apart from orthographic projections of the data lines 140 on the base substrate 110. Although the vertical conductive part and the data lines are arranged in different layers, the array substrate arranges the vertical conductive part between two adjacent data lines, so that formation of parasitic capacitance between the vertical conductive part and the data lines can be avoided.

As illustrated by FIG. 14B, the drain electrode 163 further includes a drain body part 1630 and a drain extension part 1636, the drain extension part 1636 extends from the drain body part 1630 to a vertical conductive part 1242.

Figure 14C:
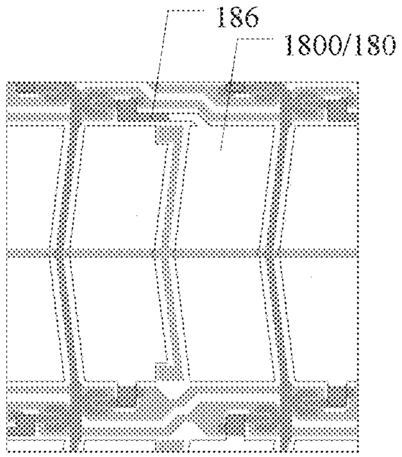

As illustrated by FIG. 14C, forming a first electrode layer 1800 on a side of the source-drain electrode layer 1400 away from the base substrate 110; the first electrode layer 1800 includes a pixel electrode 180; the pixel electrode 180 includes a pixel electrode extension part 186, the pixel electrode extension part 186 is connected with a drain extension part 1636 by overlapping. On the one hand, the drain extension part can reduce a resistance of the pixel electrode extension part; on the other hand, the pixel electrode is connected with the drain electrode through the pixel electrode extension part by overlapping, which can avoid setting a via hole connection structure between the pixel electrode and the drain electrode in a straight line, so that the aperture ratio can be further increased.

Figure 14D:
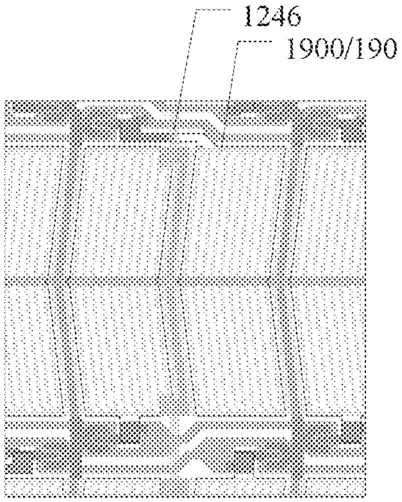

As illustrated by FIG. 14D, forming a second electrode layer 1900 on a side of the first electrode layer 1800 away from the base substrate 110; the second electrode layer 1900 includes a common electrode 190 and a vertical conductive part 1246; the vertical connect part 1246 is arranged on a different layer from the gate lines 130, and the vertical connect part 1246 connects two adjacent vertical conductive parts 1242. In this way, on the one hand, the array substrate can reduce the resistance of the common electrode line through the vertical connection part; on the other hand, the array substrate can make the common electrode line form a mesh structure through the vertical connection part, so that the voltage uniformity and stability of the common electrodes or the common electrode line of the entire array substrate are increased.

As illustrated by FIG. 14D, two ends of the vertical connection part 1246 are respectively connected with two adjacent vertical conductive parts 1242 through a via hole connection structure 150. It should be noted that, in the above method of manufacturing the array substrate, necessary steps of forming an insulating layer, forming a passivation layer and forming a flat layer are also included.

Figure 15:
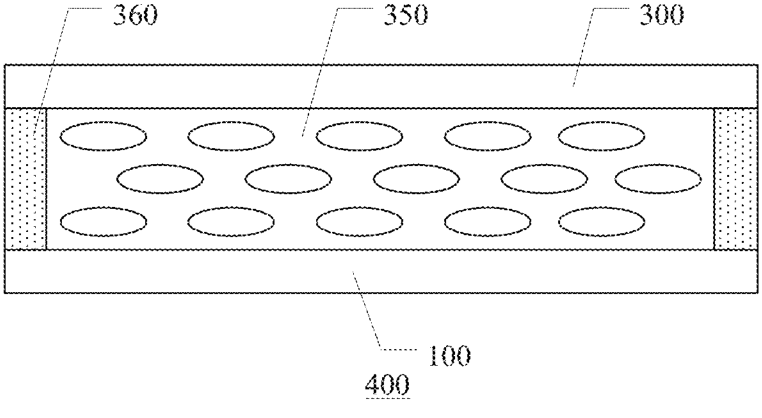
FIG. 15 is a structural schematic diagram of a display panel provided by an embodiment of the present disclosure.

An embodiment of the disclosure also provides a display panel. FIG. 15 is a structural schematic diagram of a display panel provided by an embodiment of the present disclosure. As illustrated by FIG. 15, the display panel 400 includes any one of the array substrates 100 mentioned above. In this way, the display panel has beneficial effects corresponding to the beneficial effects of the array substrate. For example, the display panel reduces the width of the black matrix and effectively increases the aperture ratio.

In some examples, as illustrated by FIG. 15, the display panel 400 further includes an opposite substrate 300, a liquid crystal layer 360 and a sealant 360; the opposite substrate 300 and the array substrate 100 are arranged opposite to each other, the liquid crystal layer 360 is used to seal the liquid crystal layer 350 between the array substrate 100 and the opposite substrate 300.

Figure 16:
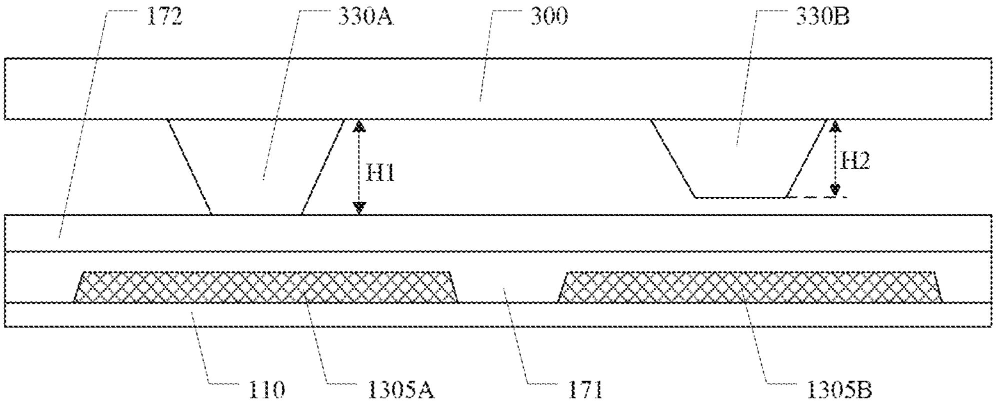
FIG. 16 is a schematic structural diagram of another display panel provided by an embodiment of the present disclosure.

FIG. 16 is a structural schematic diagram of another display panel provided by an embodiment of the present disclosure. As illustrated by FIG. 16, the display panel 400 includes a main spacer 330A and an auxiliary spacer 330B; the main spacer 330A is located between the array substrate 100 and the opposite substrate 300; and the auxiliary spacer 330B is located between the array substrate 100 and the opposite substrate 300.

In some examples, as illustrated by FIG. 16, the main spacer 330A is arranged in contact with both the array substrate 110 and the opposite substrate 300, to play a main supporting role; and the auxiliary spacer 330B is arranged in contact with at least one of the array substrate 100 and the opposite substrate 300. For example, the auxiliary spacer 330B may be arranged in contact with only the opposite substrate 300.

In some examples, as illustrated by FIG. 16, the main spacer 330A has a first height H1 in a direction perpendicular to the base substrate 110, the auxiliary spacer 330B has a second height H2 in a direction perpendicular to the base substrate 110, the first height H1 is greater than the second height H2, and a difference between the first height H1 and the second height H2 is in a range of 0.2 microns to 0.6 microns.

Figure 17:
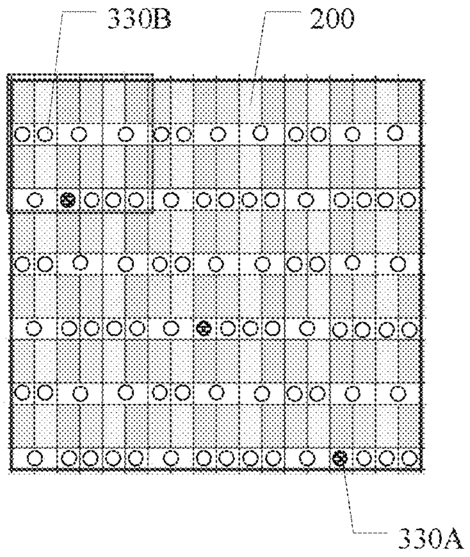
FIG. 17 is a schematic diagram of a distribution of main spacers in a display panel according to an embodiment of the present disclosure.

FIG. 17 is a schematic diagram of distribution of main spacers in a display panel according to an embodiment of the present disclosure. As illustrated by FIG. 17, one main spacer 330A is arranged for every N pixel units 200, and a range of N is from 30 to 40.

For example, as illustrated by FIG. 17, one main spacer 330A is arranged every 36 pixel units 200. The 36 pixel units 200 can form a 6*6 matrix; in this case, one main spacer 330A is arranged in the 6*6 matrix formed by the pixel units 200. Of course, the embodiments of the present disclosure include but are not limited thereto, and the 36 pixel units 200 may also form other matrices.

In some examples, a ratio of an area occupied by the main spacers to an area of the display panel is 125 $\mu m^2/mm^2$, and a ratio of an area occupied by the auxiliary spacer to the area of the display panel is 6134 $\mu m^2/mm^2$.

Figure 18:
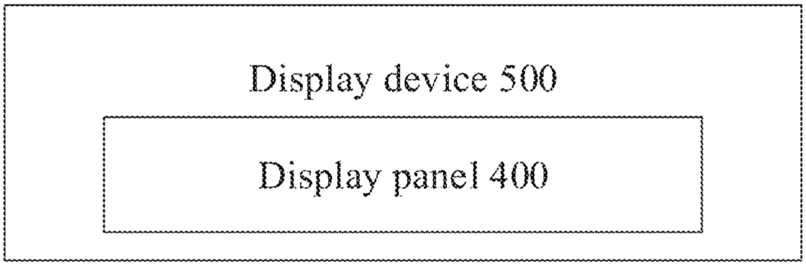
FIG. 18 is a schematic diagram of a display device provided by an embodiment of the present disclosure.

An embodiment of the present disclosure further provides a display device. FIG. 18 is a schematic diagram of a display device provided by an embodiment of the present disclosure. As illustrated by FIG. 18, the display device 500 includes the above-mentioned display panel 400.

For example, the display device may be a display device with a display function such as a TV, a computer monitor, a notebook computer, a tablet computer, a smart phone, a navigator, an electronic picture frame, and a vehicle display.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other.

The above is only the specific embodiment of this disclosure, but the protection scope of the present disclosure is not limited thereto. Any person familiar with the technical field can easily think of changes or substitutions within the technical scope disclosed in the present disclosure, and they should be included in the protection scope of the present disclosure. Therefore, the scope of protection of the present disclosure should be based on the scope of protection of the claims.

The invention claimed is:

1. An array substrate, comprising:

a base substrate;

a plurality of pixel units, located on a side of the base substrate; and a common electrode line, comprising a horizontal common electrode line and a vertical common electrode line, the horizontal common electrode line is electrically connected with the vertical common electrode line, wherein the plurality of pixel units are arranged in an array along a first direction and a second direction to form a plurality of pixel rows and a plurality of pixel columns, each of the pixel rows extends along the first direction, and each of the pixel columns extends along the second direction, the horizontal common electrode line extends along the first direction, the vertical common electrode line extends along the second direction, each of the plurality of pixel units comprises an effective display region, the horizontal common electrode line is overlapped with a plurality of effective display regions of a same pixel row, the array substrate further comprises a plurality of gate lines, arranged along the second direction; and a plurality of data lines, arranged along the first direction, each of the gate lines extends along the first direction, each of the data lines extends along the second direction, the plurality of gate lines and the plurality of data lines are arranged in different layers, and the horizontal common electrode line is arranged on a same layer as the gate lines, each of the pixel rows comprises a plurality of pixel groups, and each of the pixel groups comprises a first color pixel unit, a second color pixel unit, and a third color pixel unit that are arranged in sequence, the plurality of pixel groups comprise a first pixel group and a second pixel group sequentially arranged along the first direction, the plurality of data lines comprise a first data line, a second data line, a third data line and a fourth data line that are arranged in sequence, the first data line is located on a side of the first color pixel unit away from the second color pixel unit in the first pixel group, the second data line is located between the second color pixel unit and the third color pixel unit in the first pixel group, the third data line is located between the first color pixel unit and the second color pixel unit in the second pixel group, and the fourth data line is located on a side of the third color pixel unit away from the second color pixel unit in the second pixel group, the vertical common electrode line comprises a first vertical conductive part, a second vertical conductive part and a third vertical conductive part, the first vertical conductive part, the second vertical conductive part and the third vertical conductive part are all arranged on a same layer as the gate lines, the first vertical conductive part is located between the first color pixel unit and the second color pixel unit in the first pixel group, the second vertical conductive part is located between the third color pixel unit in the first pixel group and the first color pixel unit in the second pixel group, the third vertical conductive part is located between the second color pixel unit and the third color pixel unit in the second pixel group, the first vertical conductive part, the second vertical conductive part and the third vertical conductive part are all located between two gate lines of the gate lines, and are respectively intersected with the horizontal common electrode line, and form three integrated cross-shaped conductive structures at intersection positions.

2. The array substrate according to claim 1, wherein the effective display region comprises a first domain and a second domain arranged in the second direction, and the horizontal common electrode line is located between the first domain and the second domain.

3. The array substrate according to claim 1, wherein the vertical common electrode line comprises a vertical conductive part, the vertical conductive part is arranged on a same layer as the gate lines, the vertical conductive part is located between two pixel units adjacent in the first direction, the vertical conductive part is located between two gate lines of the gate lines, is intersected with the horizontal common electrode line, and form an integrated cross-shaped conductive structure at an intersection position.

4. The array substrate according to claim 3, wherein the vertical conductive part is located between two data lines adjacent in the first direction, and an orthographic projection of the vertical conductive part on the base substrate and orthographic projections of the data lines on the base substrate are spaced apart.

5. The array substrate according to claim 3, wherein the vertical common electrode line comprises a vertical connection part, the vertical connection part and the gate lines are arranged in different layers, and the vertical connection part connects two vertical conductive parts adjacent in the second direction.

6. The array substrate according to claim 5, wherein two ends of the vertical connection part are respectively connected with the two vertical conductive parts adjacent in the second direction through a via hole connection structure, the plurality of pixel units comprise a first color pixel unit, a second color pixel unit and a third color pixel unit, and an orthographic projection of the via hole connection structure on the base substrate is at least partially overlapped with an orthographic projection of an effective display region of the third color pixel unit on the base substrate.

7. The array substrate according to claim 5, wherein each of the pixel units further comprises:

a pixel electrode, located on a side of a film layer where the data lines are located away from the base substrate; and a common electrode, located on a side of the pixel electrode away from the base substrate, wherein the vertical connection part is arranged on a same layer as the common electrode.

8. The array substrate according to claim 7, wherein at least one of the pixel units further comprises:

a driving transistor, comprising a gate electrode, a source electrode and a drain electrode, wherein the gate electrode is connected with one of the gate lines, the pixel electrode is connected with the drain electrode, the common electrode is connected with the common electrode line, the drain electrode comprises a drain body part and a drain extension part, the drain extension part extends from the drain body part to the vertical connection part, the pixel electrode comprises a pixel electrode extension part, and the pixel electrode extension part is connected with the drain electrode extension part by overlapping.

9. The array substrate according to claim 8, wherein an orthographic projection of the drain extension part on the base substrate and an orthographic projection of the vertical connection part on the base substrate are spaced apart, and a distance between the orthographic projection of the drain extension part on the base substrate and the orthographic projection of the vertical connection part on the base substrate is in the range of 0 microns to 3 microns.

10. The array substrate according to claim 3, wherein each of the gate lines comprises a spacer support part, and a region where the spacer support part is located is configured to place a spacer, an orthographic projection of the spacer support part on the base substrate is located between an orthographic projection of an extension line of the vertical conductive part on the base substrate and an orthographic projection of a data line closest to the vertical conductive part on the base substrate.

11. The array substrate according to claim 3, wherein each of the gate lines comprises a spacer support part, and a region where the spacer support part is located is configured to place a spacer, an orthographic projection of the spacer support part on the base substrate is at least partially overlapped with an orthographic projection of an extension line of the vertical conductive part on the base substrate.

12. The array substrate according to claim 1, wherein the vertical common electrode line further comprises:

a first vertical connection part, arranged on a different layer from the gate lines, and connecting two second vertical conductive parts adjacent in the second direction; and a second vertical connection part, arranged on a different layer from the gate lines, and connecting two third vertical conductive parts adjacent in the second direction, two ends of the first vertical connection part are respectively connected with the two second vertical conductive parts adjacent in the second direction through a first via hole connection structure, an orthographic projection of the first via hole connection structure on the base substrate is at least partially overlapped with an orthographic projection of an effective display region of the third color pixel unit the on the base substrate, two ends of the second vertical connection part are respectively connected with two third vertical conductive parts adjacent in the second direction through a second via hole connection structure, and an orthographic projection of the second via hole connection structure on the base substrate is at least partially overlapped with the orthographic projection of the effective display region of the third color pixel unit on the base substrate.

13. The array substrate according to claim 12, wherein each of the gate lines comprises a plurality of spacer support parts, a region where each of the spacer support parts is located is configured to place a spacer, the plurality of spacer support parts comprise a main spacer support part and an auxiliary spacer support part, an orthographic projection of the main spacer support part on the base substrate is located between an orthographic projection of the first vertical connection part on the base substrate and an orthographic projection of the data line closest to the first vertical connection portion on the base substrate, or the orthographic projection of the main spacer support part on the base substrate is located between an orthographic projection of the second vertical connection part on the base substrate and the orthographic projection of the data line closest to the second vertical connection part on the base substrate.

14. The array substrate according to claim 1, wherein the plurality of pixel rows comprise a first pixel row and a second pixel row that are sequentially arranged along the second direction, the plurality of gate lines comprise a first gate line, a second gate line, a third gate line and a fourth gate line arranged in sequence, the first gate line is located on a side of the second pixel row away from the first pixel row, the second gate line and the third gate line are located between the first pixel row and the second pixel row, the third gate line is located on a side of the second gate line away from the first gate line, and the fourth gate line is located on a side of the first pixel row away from the second pixel row.

15. A display panel, comprising the array substrate according to claim 1.

16. The display panel according to claim 15, further comprising:

an opposite substrate, arranged opposite to the array substrate;

a main spacer, located between the array substrate and the opposite substrate; and an auxiliary spacer, located between the array substrate and the opposite substrate.

17. The display panel according to claim 16, wherein the main spacer is arranged in contact with both the array substrate and the opposite substrate, and the auxiliary spacer is arranged in contact with at least one of the array substrate and the opposite substrate.

18. A display device comprising the display panel according to claim 15.

* * * * *